US012768862B2

(12) United States Patent
Deak et al.

(10) Patent No.: US 12,768,862 B2
(45) Date of Patent: Oct. 20, 2026

(54) LASER WRITING APPARATUS AND METHOD FOR PROGRAMMING MAGNETORESISTIVE DEVICES

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

(*) Notice: Subject to any disclaimer, the term of this patent is extended or adjusted under 35 U.S.C. 154(b) by 422 days.

(21) Appl. No.: 18/549,104

(22) PCT Filed: Mar. 2, 2022

(86) PCT No.: PCT/CN2022/078776
§ 371 (c)(1),
(2) Date: Sep. 5, 2023

(87) PCT Pub. No.: WO2022/184090
PCT Pub. Date: Sep. 9, 2022

(65) Prior Publication Data

US 2024/0118317 A1 Apr. 11, 2024

(30) Foreign Application Priority Data

Mar. 5, 2021 (CN) ........................ 202110247124.X

(51) Int. Cl.
*H10N 35/01* (2023.01)
*G01R 3/00* (2006.01)
(Continued)

(52) U.S. Cl.
CPC ............... *G01R 3/00* (2013.01); *G01R 33/09* (2013.01); *G11B 5/3967* (2013.01); *H10N 35/01* (2023.02)

(58) Field of Classification Search
CPC ........ G01R 3/00; G01R 33/09; G01R 33/093; G01R 33/096; G01R 33/0094;
(Continued)

(56) References Cited

U.S. PATENT DOCUMENTS 8,059,374 B2 * 11/2011 Zhao ...................... B82Y 25/00 360/324.11
2007/0159164 A1 7/2007 Hehn et al.
(Continued)

FOREIGN PATENT DOCUMENTS

CN 1826672 A 8/2006
CN 101393757 A 3/2009
(Continued)

OTHER PUBLICATIONS

"Chinese Application No. 202110247124.X, First Search dated Aug. 26, 2022", (Aug. 26, 2022), 2 pgs.
(Continued)

*Primary Examiner* — Xiaochun L Chen
(74) *Attorney, Agent, or Firm* — Schwegman Lundberg & Woessner, P.A.

(57) ABSTRACT

A laser-programmable magnetoresistive device includes a substrate, a magnetoresistive sensor, and a thermal control layer sequentially arranged in a stacked manner. A non-magnetic insulating layer for electrical isolation is provided between the magnetoresistive sensor and the thermal control layer. The magnetoresistive sensor is composed of a magnetoresistive sensing unit, which is a multilayer thin-film stacked structure containing an anti-ferromagnetic layer. During laser programming, parameters of the thermal control layer and/or the magnetoresistive sensor are varied to change the thermal response produced by the laser on the magnetoresistive sensor, to increase or decrease the temperature of the magnetoresistive sensor at the same laser
(Continued)

power. The film parameters used include material composition and film thickness. High precision laser programming of a magnetoresistive sensor is obtained, with improved magnetoresistive sensor manufacturability, improved magnetoresistive sensor noise performance, and improved magnetoresistive sensor detectability.

20 Claims, 13 Drawing Sheets

(51) Int. Cl.
*G01R 33/09* (2006.01)
*G11B 5/39* (2006.01)

(58) Field of Classification Search
CPC ............ G01R 33/0206; G01R 33/0052; G11B 5/3967; H10N 35/01; G01D 5/16
See application file for complete search history.

(56) References Cited

U.S. PATENT DOCUMENTS

| | | | | |
|---|---|---|---|---|
| 2011/0279921 | A1* | 11/2011 | Zhang .................... | H10N 50/85 360/59 |
| 2012/0049843 | A1 | 3/2012 | Sun et al. | |
| 2019/0227129 | A1* | 7/2019 | Deak .................. | G01R 33/0005 |
| 2020/0350120 | A1* | 11/2020 | Han .................... | H01F 10/3268 |
| 2023/0292624 | A1* | 9/2023 | Timopheev ........ | G01R 33/0052 |

FOREIGN PATENT DOCUMENTS

| | | | | |
|---|---|---|---|---|
| CN | 202404138 | U | | 8/2012 |
| CN | 103076577 | A | | 5/2013 |
| CN | 104776794 | | | 7/2015 |
| CN | 105742483 | A | | 7/2016 |
| CN | 108259032 | A | | 7/2018 |
| CN | 110289349 | A | | 9/2019 |
| CN | 113029208 | A | | 6/2021 |
| JP | 2020008285 | A | * | 1/2020 |
| WO | WO-2017036352 | A1 | | 3/2017 |
| WO | WO-2022184090 | A1 | | 9/2022 |

OTHER PUBLICATIONS

"Chinese Application No. 202110247124.X, Notification to Grant Patent Right for Invention dated Sep. 15, 22", (Sep. 15, 2022), 3 pgs.
"International Application No. PCT/CN2022/078776, International Search Report mailed May 16, 2022", (May 16, 2022), 5 pgs.
"International Application No. PCT/CN2022/078776, International Written Opinion mailed May 16, 2022", (May 16, 2022), 8.

* cited by examiner

LASER WRITING APPARATUS AND METHOD FOR PROGRAMMING MAGNETORESISTIVE DEVICES

PRIORITY CLAIM TO RELATED APPLICATIONS

This application is a U.S. national stage filing under 35 U.S.C. § 371 from International Application No. PCT/CN2022/078776, filed on 2 Mar. 2022, and published as WO2022/184090 on 9 Sep. 2022, which claims the benefit under 35 U.S.C. 119 to Chinese Application No. 202110247124.X, filed on 5 Mar. 2021, the benefit of priority of each of which is claimed herein, and which applications and publication are hereby incorporated herein by reference in their entirety.

TECHNICAL FIELD

Embodiments of the present invention pertains to the technical field of magnetic sensors, and in particular pertains to a laser writing apparatus and method for programming magnetoresistive devices.

BACKGROUND

Magnetoresistive devices comprise linear sensors, angle sensors, switching sensors, gradient sensors, and various downstream magnetoresistive devices such as current sensors, financial magnetic heads, image sensors, magnetoelectric encoders and magnetoelectric isolators. Magnetoresistive sensors are integrated within the magnetoresistive devices, and types of magnetoresistive sensors comprise tunnel magnetoresistive (TMR) sensors, giant magnetoresistive (GMR) sensors and anisotropic magnetoresistive (AMR) sensors.

At present, a magnetoresistive sensor is manufactured by first performing magnetic field annealing on an entire wafer and then packaging it by flip-die packaging. Specifically, two identical dies are selected during packaging, one of the dies is rotated by 180° relative to the other die, and then wire bonding is performed to obtain the magnetoresistive sensor.

However, this manufacturing method has a defect that relative phases of the two wafers needs subsequent operations, which makes it difficult to guarantee precision and affects performance of the magnetoresistive sensor, further reducing detection precision of the magnetoresistive sensor and increasing process complexity of the magnetoresistive sensor.

SUMMARY

The embodiments of the present invention provide a laser writing apparatus and method for programming magnetoresistive devices for the purpose of manufacturing high-precision magnetoresistive sensors.

The embodiments of the present invention provide a laser writing apparatus for programming magnetoresistive devices. The apparatus comprises: a substrate, a magnetoresistive sensor and a thermal control layer which are sequentially arranged in a stacked manner. A non-magnetic insulating layer for electrical isolation is provided between the magnetoresistive sensor and the thermal control layer. The magnetoresistive sensor is composed of a magnetoresistive sensing unit which is a multilayer thin-film stacked structure having an anti-ferromagnetic layer.

The laser writing apparatus for programming is configured to, in a phase of laser writing for programming, change film layer parameters of the thermal control layer and/or the magnetoresistive sensor to adjust a change rate of a temperature of the magnetoresistive sensor along with a laser power, and to increase or decrease a temperature of writing into the magnetoresistive sensor at the same laser power, and the film layer parameters comprise at least one of a film layer material and a film layer thickness.

Based on the same inventive concept, the embodiments of the present invention also provide a laser writing method for programming magnetoresistive devices implemented by a laser writing system for programming, and the laser writing system for programming comprises a magnetic field generating apparatus and the laser writing apparatus for programming as described above; and the laser writing method for programming of the laser writing system for programming comprises:

changing, in a phase of laser writing for programming, film layer parameters of the thermal control layer and/or the magnetoresistive sensor which comprise at least one of a film layer material and a film layer thickness; and adjusting a change rate of a temperature of the magnetoresistive sensor along with a laser power, and increasing or decreasing a temperature of writing into the magnetoresistive sensor at the same laser power.

In the embodiments of the present invention, a laser writing apparatus for programming comprises: a substrate, a magnetoresistive sensor located on the substrate and a thermal control layer located on the magnetoresistive sensor; a non-magnetic electrical insulating layer is provided between the thermal control layer and the magnetoresistive sensor; the magnetoresistive sensor comprises a magnetoresistive sensing unit, and the magnetoresistive sensing unit is a multilayer thin-film stacked structure comprising an anti-ferromagnetic layer; and parameters of the thermal control layer change, which can increase or decrease a change rate of a temperature of a corresponding magnetoresistive sensing unit array along with a laser power at which the writing is performed, and increase or decrease the temperature of the magnetoresistive sensing unit array when laser writing for programming is performed at the same laser power, thereby achieving high-precision laser writing for programming the magnetoresistive sensor, improving manufacturing defects of the magnetoresistive sensor, improving performance of the magnetoresistive sensor, and further improving detection precision of the magnetoresistive sensor.

BRIEF DESCRIPTION OF THE DRAWINGS

In order to illustrate the technical solutions of the embodiments of the present invention or in the prior art more clearly, the accompanying drawings required for the description of the embodiments or the prior art will be briefly introduced below. Apparently, the accompanying drawings in the following description, while being some specific embodiments of the present invention, may be expanded and extended to other structures and drawings for those skilled in the art according to the basic concepts of device structures, driving methods and manufacturing methods as disclosed and suggested by various embodiments of the present invention. Undoubtedly, these should be within the scope of the claims of the present invention.

DESCRIPTION OF THE EMBODIMENTS

In order to make the objects, technical solutions and advantages of the present invention more clear, the technical solutions of the present invention will be clearly and completely described hereinafter by way of embodiments with reference to the accompanying drawings in the embodiments of the present invention, and it is obvious that the embodiments described are only some, instead of all, of the embodiments of the present invention. All other embodiments obtained by those skilled in the art based on the basic concepts as disclosed and suggested by the embodiments of the present invention are within the scope of the present invention.

Figure 1:
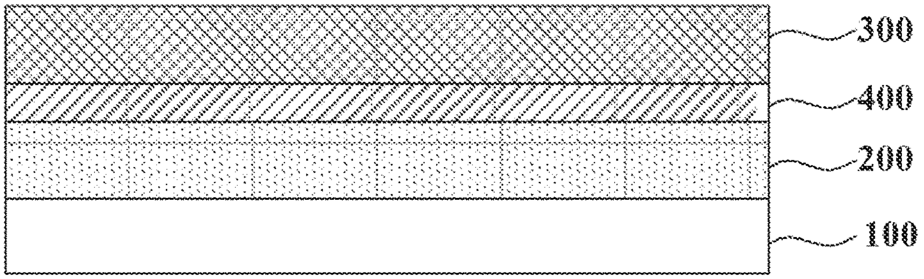
FIG. 1 is a schematic diagram of a laser writing apparatus for programming magnetoresistive devices according to an embodiment of the present invention.

Referring to FIG. 1, there is shown a schematic diagram of a laser writing apparatus for programming magnetoresistive devices according to an embodiment of the present invention. As shown in FIG. 1, the laser writing apparatus for programming comprises: a substrate 100, a magnetoresistive sensor 200 and a thermal control layer 300 which are sequentially arranged in a stacked manner; a non-magnetic insulating layer 400 for electrical isolation is provided between the magnetoresistive sensor 200 and the thermal control layer 300, and the magnetoresistive sensor 200 is composed of a magnetoresistive sensing unit which is a multilayer thin-film stacked structure having an anti-ferromagnetic layer; and the laser writing apparatus for programming is configured to change, in a phase of laser writing for programming, film layer parameters of the thermal control layer 300 and/or the magnetoresistive sensor 200 to adjust a change rate of a temperature of the magnetoresistive sensor 200 along with a laser power, and to increase or decrease the temperature of writing into the magnetoresistive sensor 200 at the same power, and the film layer parameters comprise at least one of a film layer material and a film layer thickness.

In the present embodiment, optionally, the substrate 100 is a wafer; the magnetoresistive sensor 200 is composed of a magnetoresistive sensing unit which is a multilayer thin-film stacked structure having an anti-ferromagnetic layer; and the non-magnetic insulating layer 400 is arranged between the magnetoresistive sensor 200 and the thermal control layer 300, and the non-magnetic insulating layer 400 serves to electrically insulate the magnetoresistive sensor 200 from the thermal control layer 300.

A process of laser writing for programming is a process of writing laser into the magnetoresistive sensor 200, which realizes programming of a magnetic moment of the anti-ferromagnetic layer in the magnetoresistive sensor 200, and this process is also defined as a phase of laser writing for programming. In the phase of laser writing for programming, the change rate of the temperature T of the magnetoresistive sensor 200 during a heat transfer process varies with a magnitude of the laser power P of writing into the magnetoresistive sensor 200; therefore, adjusting the magnitude of the laser power of writing into the magnetoresistive sensor 200 can increase or decrease the change rate of the temperature of the magnetoresistive sensor 200 along with the laser power, and the change rate of temperature is dT/dP, thereby controlling the temperature of writing into the magnetoresistive sensor 200 at the same laser power.

When laser is written into the magnetoresistive sensor 200, the laser needs to pass through the thermal control layer 300. If the thermal control layer 300 changes in terms of material or thickness, the laser passes through the thermal control layer 300 with different film parameters at the same laser power, and the laser power of actually writing into the magnetoresistive sensor 200 will also change accordingly. Based on this, increasing or decreasing the material or the thickness of the thermal control layer 300 can adjust the magnitude of the same laser power of actually writing into the magnetoresistive sensor 200, thereby controlling a thermal conductivity of the magnetoresistive sensor 200 under the action of the laser, so that the thermal conductivity of the magnetoresistive sensor 200 changes in response to the change in the laser power, thereby adjusting the change rate of the temperature of the magnetoresistive sensor 200 along with the laser power, thereby controlling the temperature of writing into the magnetoresistive sensor 200 at the same laser power, or vice versa.

According to the temperature and/or the change rate required for the magnetoresistive sensor 200 and the constant film parameters of the thermal control layer 300, the required laser power is inversely derived, and the laser writing apparatus for programming is driven to emit laser according to the calculated laser power, and when the laser is written into the magnetoresistive sensor 200 through the thermal control layer 300, the laser power of actually writing into the magnetoresistive sensor 200 can adjust the magnetoresistive sensor 200 to the required change rate of temperature and the required temperature.

In summary, under the action of the same laser, increasing or decreasing the material or the thickness of the thermal control layer 300 can increase or decrease the change rate of the temperature of the magnetoresistive sensor 200 along with the change in the magnitude of the laser power, thereby adjusting the temperature of the magnetoresistive sensor 200 at the same laser power, such as increasing or decreasing the temperature of the magnetoresistive sensor 200, thereby programming the magnetic moment of the anti-ferromagnetic layer in the magnetoresistive sensor 200.

Similarly, it can be seen that the magnetoresistive sensing unit is a multilayer thin-film stacked structure having an anti-ferromagnetic layer. When the laser is written into the magnetoresistive sensor 200, on a laser propagation path, the laser will successively pass through each film layer located on the anti-ferromagnetic layer in the magnetoresistive sensor 200 and then enter the anti-ferromagnetic layer. Then, if the material or the thickness of at least one film layer which is located on the anti-ferromagnetic layer in the magnetoresistive sensor 200 and through which the laser passes changes, such as increase or decrease, the laser power of actually writing into the magnetoresistive sensor 200 will also change accordingly, so that the thermal conductivity of the magnetoresistive sensor 200 changes in response to the change in the laser power, thereby adjusting the change rate of the temperature of the magnetoresistive sensor 200 along with the laser power, further controlling the temperature of writing into the magnetoresistive sensor 200 at the same laser power, and programming the magnetic moment of the anti-ferromagnetic layer in the magnetoresistive sensor 200.

Optionally, a wavelength range of the laser is between 100 nm and 3000 nm. The laser power is adjusted within this range to control the temperature of the magnetoresistive sensor. In other embodiments, further optionally, the thermal control layer is located within the multilayer thin-film stacked structure.

In the embodiments of the present invention, a laser writing apparatus for programming comprises: a substrate, a magnetoresistive sensor located on the substrate and a thermal control layer located on the magnetoresistive sensor; a non-magnetic electrical insulating layer is provided between the thermal control layer and the magnetoresistive sensor; the magnetoresistive sensor comprises a magnetoresistive sensing unit, and the magnetoresistive sensing unit is a multilayer thin-film stacked structure comprising an anti-ferromagnetic layer; and parameters of the thermal control layer change, which can increase or decrease a change rate of a temperature of a corresponding magnetoresistive sensing unit array along with a laser power at which the writing is performed, and increase or decrease the temperature of the magnetoresistive sensing unit array when laser writing for programming is performed at the same laser power, thereby achieving high-precision laser writing for programming the magnetoresistive sensor, improving manufacturing defects of the magnetoresistive sensor, improving performance of the magnetoresistive sensor, and further improving detection precision of the magnetoresistive sensor.

Illustratively, on the basis of the above-mentioned basic solution, optionally, the magnetoresistive sensor is a giant magnetoresistive (GMR) sensor, a tunnel magnetoresistive (TMR) sensor or an anisotropic magnetoresistive (AMR) sensor. Optionally, in a direction from the substrate to the thermal control layer, the multilayer thin-film stacked structure comprises a seed layer, the anti-ferromagnetic layer, a free layer, a top electrode layer and a cap layer which are sequentially arranged in a stacked manner, and a first insulating layer is provided between the substrate and the seed layer; the laser writing apparatus for programming is configured to change a material of at least one film layer of the thermal control layer, the first insulating layer, the seed layer, the top electrode layer and the cap layer to increase or decrease the temperature of writing into the magnetoresistive sensor at the same laser power: and/or the laser writing apparatus for programming is configured to change a thickness of at least one film layer of the thermal control layer, the first insulating layer, the seed layer, the top electrode layer and the cap layer to increase or decrease a temperature of writing into the magnetoresistive sensor at the same laser power.

Figure 2:
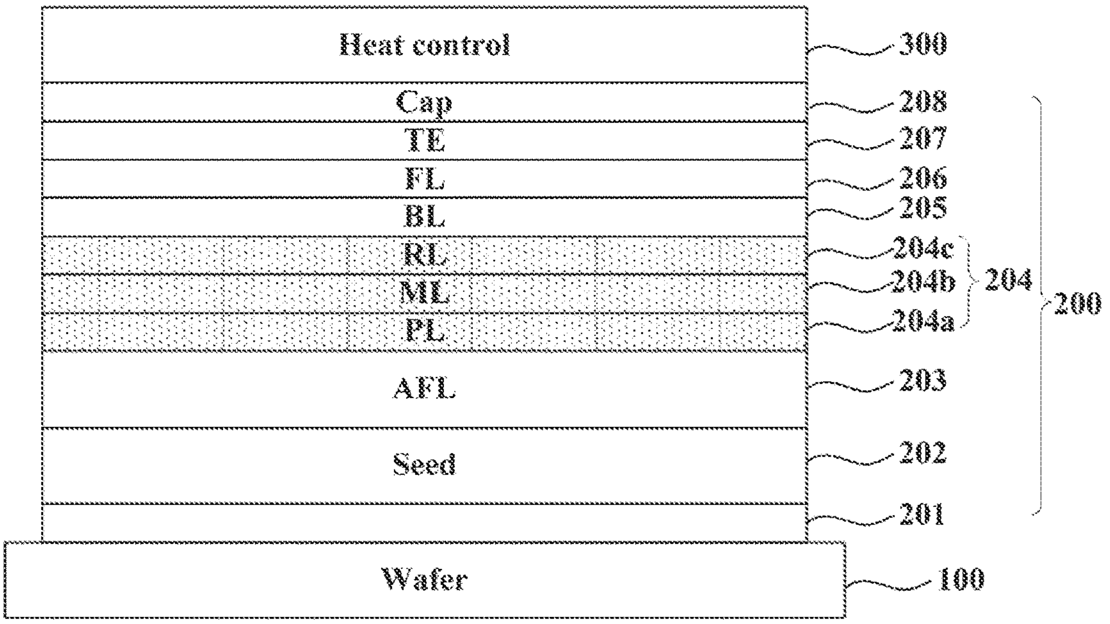
FIG. 2 is a schematic diagram of a multilayer thin-film stack of a laser writing apparatus for programming according to an embodiment of the present invention.

Referring to FIG. 2, there is shown a schematic diagram of a multilayer thin-film stack of a laser writing apparatus for programming according to an embodiment of the present invention. As shown in FIG. 2, optionally, the magnetoresistive sensor 200 is a GMR or TMR sensor, and the magnetoresistive sensor 200 comprises a SAF reference layer 204. In the present embodiment, the laser writing apparatus for programming comprises a substrate 100, a magnetoresistive sensor 200 located on the substrate 100, and a thermal control layer (Heat control) 300 located on the magnetoresistive sensor 200. It should be appreciated that a non-magnetic insulating layer (not shown) is further provided between the magnetoresistive sensor 200 and the thermal control layer 300. Optionally, the substrate 100 is a wafer, but is not limited thereto.

The magnetoresistive sensor 200 is composed of one or more magnetoresistive sensing units, and the magnetoresistive sensing unit is a multilayer thin-film stacked structure. In a direction from the substrate 100 to the thermal control layer 300, the multilayer thin-film stacked structure sequentially comprises a first insulating layer 201, a seed layer (Seed) 202, an anti-ferromagnetic layer (AFL) 203, the SAF reference layer 204, a barrier layer (BL) 205, a free layer (FL) 206, a top electrode layer (TE) 207 and a cap layer (CAP) 208. Among them, the SAF reference layer 204 comprises a pinning layer (PL) 204*a*, a metal layer (ML) 204*b*, and a reference layer (RL) 204*c*.

Figure 3:
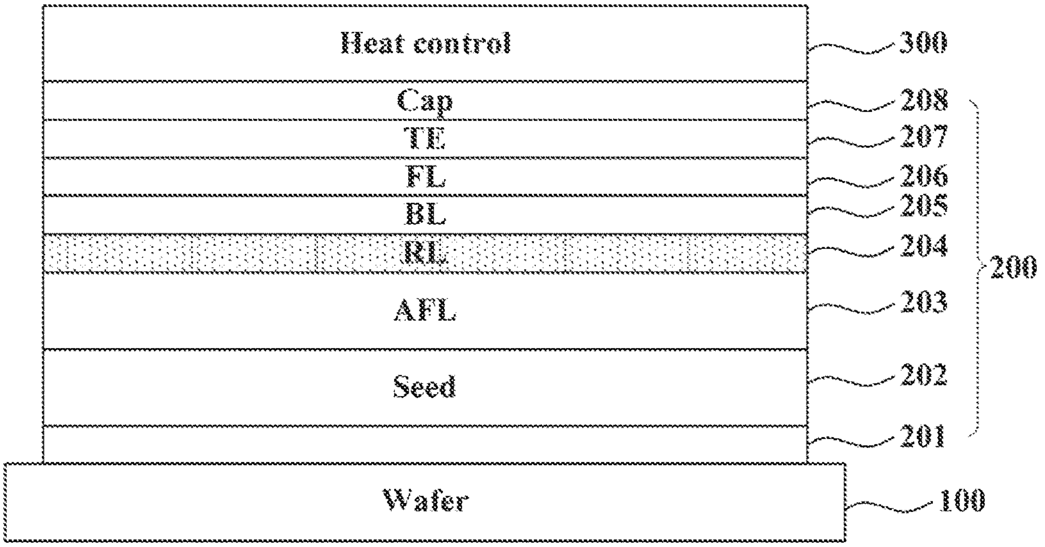
FIG. 3 is a schematic diagram of another multilayer thin-film stacked structure.

Referring to FIG. 3, there is shown a schematic diagram of a multilayer thin-film stack of another laser writing apparatus for programming according to an embodiment of the present invention. As shown in FIG. 3, optionally, the magnetoresistive sensor 200 is a GMR or TMR sensor. The difference from FIG. 2 is that in FIG. 3, the SAF reference layer of the magnetoresistive sensor 200 comprises the reference layer (RL) 204.

With regard to the magnetoresistive sensor 200 shown in FIGS. 2 and 3, if the barrier layer (BL) 205 is a film layer made of a metal material, and optionally, the metal material comprises any one or an alloy of Ta, Ru and Cu, then the magnetoresistive sensing unit is a GMR sensing unit; and if the barrier layer (BL) 205 is a film layer made of a non-metallic material, and optionally, the non metallic material comprises at least one of $Al_2O_3$ and MgO, then the magnetoresistive sensing unit is a TMR sensing unit.

Figure 4:
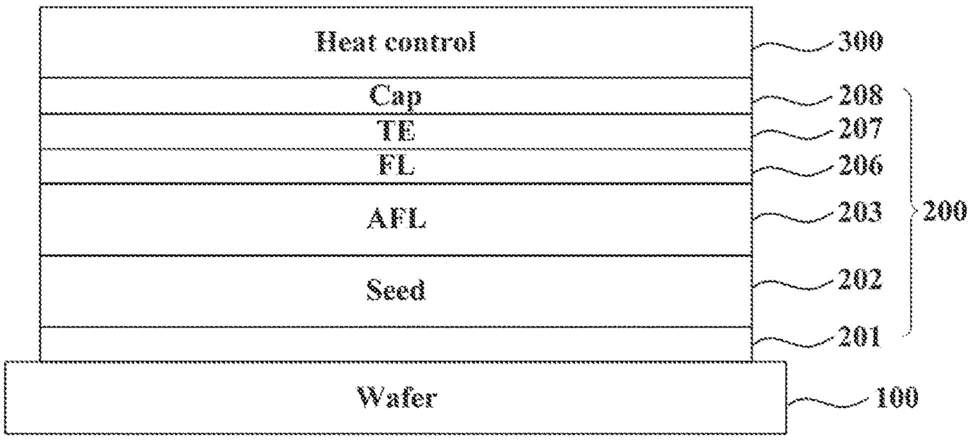
FIG. 4 is a schematic diagram of yet another multilayer thin-film stacked structure.

Referring to FIG. 4, there is shown a schematic diagram of a multilayer thin-film stack of yet another laser writing apparatus for programming according to an embodiment of the present invention. As shown in FIG. 4, optionally, the magnetoresistive sensor 200 is an AMR sensor. The difference from FIG. 2 is that in FIG. 4, the magnetoresistive sensor 200 does not comprise the SAF reference layer and the barrier layer (BL).

Illustratively, on the basis of the above-mentioned basic solution, optionally, the magnetoresistive sensor is a push-pull magnetoresistive sensor, the push-pull magnetoresistive sensor is composed of a push magnetoresistive sensing unit array and a pull magnetoresistive sensing unit array, and both the push magnetoresistive sensing unit array and the pull magnetoresistive sensing unit array are composed of magnetoresistive sensing units. The push-pull magnetoresistive sensor is of a full-bridge structure, a half-bridge structure or a quasi-bridge structure.

Figure 5:
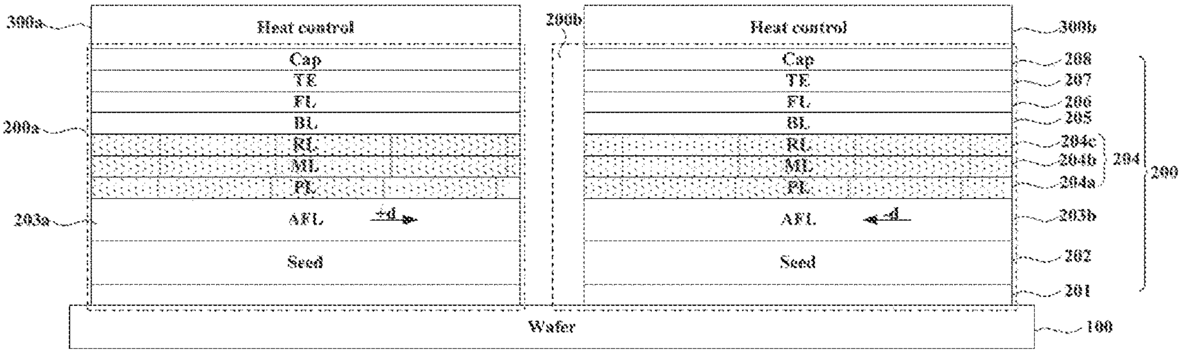
FIG. 5 is a schematic diagram of a magnetoresistive sensor according to an embodiment of the present invention.

Referring to FIG. 5, there is shown a schematic diagram of a magnetoresistive sensor according to an embodiment of the present invention. As shown in FIG. 5, the magnetoresistive sensor is located between a substrate 100 and a thermal control layer. Optionally, the magnetoresistive sensor is a push-pull magnetoresistive sensor 200. In the present embodiment, the push-pull magnetoresistive sensor 200 comprises a push magnetoresistive unit array and a pull magnetoresistive unit array, the push magnetoresistive unit array is composed of push magnetoresistive sensing units 200*a*, and the pull magnetoresistive unit array is composed of pull magnetoresistive sensing units 200*b*. The magnetoresistive sensor shown in this FIG. 5 is illustrated with the GMR/TMR sensor having the SAF reference layer as shown in FIG. 2, but analysis processes and results thereof are equally applicable to other magnetoresistive sensors with different SAF reference layers or without a SAF reference layer.

The push magnetoresistive sensing unit 200*a* and the pull magnetoresistive sensing unit 200*b* are located on the same substrate 100, the thermal control layer located on the push magnetoresistive sensing unit 200*a* is a push thermal control layer 300*a*, and the thermal control layer located on the pull magnetoresistive sensing unit 200*b* is a pull thermal control layer 300*b*. An anti-ferromagnetic layer 203*a* in a multilayer thin-film stacked structure of the push magnetoresistive sensing unit 200*a* and an anti-ferromagnetic layer 203*b* in a multilayer thin-film stacked structure of the pull magnetoresistive sensing unit 200*b* have opposite magnetic moment directions, in which the anti-ferromagnetic layer 203*a* in the push magnetoresistive sensing unit 200*a* has a magnetic moment direction+d, and the anti-ferromagnetic layer 203*b* in the pull magnetoresistive sensing unit 200*b* has a magnetic moment direction −d, and d can be an X direction, a Y direction or a Z direction.

The identically named film layers below in the push magnetoresistive sensing unit 200*a* and the pull magnetoresistive sensing unit 200*b* have the same materials and properties. Specifically, respective pinning layers (PL) 204*a* in the push magnetoresistive sensing unit 200*a* and in the pull magnetoresistive sensing unit 200*b* have the same material and the same properties, respective metal layers (ML) 204*b* therein have the same material and the same properties, respective reference layers (RL) 204*c* therein have the same material and the same properties, respective barrier layers (BL) 205 therein have the same material and the same properties, and respective free layers (FL) 206 have the same material and the same properties.

In order to form a difference in thermal conductivity between the push magnetoresistive sensing unit 200*a* and the pull magnetoresistive sensing unit 200*b* in the magnetoresistive sensor at a same laser power, at least one of the following film layer design schemes can be implemented:

1) A cap layer (CAP) of the push magnetoresistive sensing unit 200*a* and a cap layer 208 of the pull magnetoresistive sensing unit 200*b* use different materials and/or thicknesses;
2) A top electrode layer (TE) of the push magnetoresistive sensing unit 200*a* and a top electrode layer 207 of the pull magnetoresistive sensing unit 200*b* use different materials and/or thicknesses;
3) A seed layer (Seed) of the push magnetoresistive sensing unit 200*a* and a seed layer 202 of the pull magnetoresistive sensing unit 200*b* use different materials and/or thicknesses;
4) A first insulating layer of the push magnetoresistive sensing unit 200*a* and a first insulating layer 201 of the pull magnetoresistive sensing unit 200*b* use different materials and/or thicknesses; and
5) The push thermal control layer 300*a* of the push magnetoresistive sensing unit 200*a* and the pull thermal control layer 300*b* of the pull magnetoresistive sensing unit 200*b* use different materials and/or thicknesses.

Any one or combination of more of the above film design schemes 1) to 5) can be used in a process of laser writing for programming to realize the difference in thermal conductivity between the push magnetoresistive sensing unit 200*a* and the pull magnetoresistive sensing unit 200*b*, and finally realize a difference in temperature between the anti-ferromagnetic layer (AFL) of the push magnetoresistive sensing unit 200*a* and the anti-ferromagnetic layer (AFL) of the pull magnetoresistive sensing unit 200*b* when writing at the same laser power, thereby changing the process and parameters of laser writing for programming and realizing separate writing of the magnetic moments of the anti-ferromagnetic layers.

Illustratively, optionally, constituent materials of the thermal control layer comprise non-magnetic laser low absorption coefficient materials or laser high absorption coefficient materials, in which the laser low absorption coefficient materials comprise at least one of tantalum, titanium, copper, molybdenum, gold, silver, aluminum, platinum and tin, and the laser high absorption coefficient materials comprise at least one of zirconium oxide, titanium oxide, carbon film, phosphate and aluminum titanium nitride. Optionally, the constituent materials of the thermal control layer comprise carbon black, a non-magnetic laser absorbing resin or a non-magnetic laser absorbing coating.

The thermal control layer may be an air layer. Alternatively, the thermal control layer is a non-magnetic material. The non-magnetic materials constituting the thermal control layer comprise laser low absorption coefficient materials, such as at least one of Ta, Ti, Cu, Mo, Au, Ag, $Al_2$, Mo, Pt and Sn. Alternatively, the non-magnetic materials constituting the thermal control layer comprise laser high absorption coefficient materials, such as at least one of ZrO, TiO, carbon film, phosphate and TiAIN. If the thermal control layer is made of a non-magnetic material, electrical isolation may be achieved between the thermal control layer and the magnetoresistive sensor using an electrical insulating material, that is, a non-magnetic insulating layer is arranged therebetween. Further optionally, the constituent materials of the thermal control layer comprise carbon black, a laser absorbing resin or a laser absorbing coating, and the laser absorbing resin and the laser absorbing coating comprise a mixture of polymers, carbon black and oxide particles.

Optionally, the push-pull magnetoresistive sensor is a single-axis push-pull magnetoresistive sensor, a two-axis push-pull magnetoresistive sensor or a three-axis push-pull magnetoresistive sensor.

Optionally, the push-pull magnetoresistive sensor is a single-axis push-pull magnetoresistive sensor. For example, the magnetoresistive sensor is an X-axis push-pull magnetoresistive sensor which comprises a+X magnetoresistive sensing unit array and a−X magnetoresistive sensing unit array. Alternatively, the +X magnetoresistive sensing unit array and the −X magnetoresistive sensing unit array as well as a flux concentrator form a Y-axis push-pull magnetoresistive sensor. Alternatively, the +X magnetoresistive sensing unit array and the −X magnetoresistive sensing unit array as well as a flux concentrator form a Z-axis push-pull magnetoresistive sensor. Alternatively, +Y and −Y magnetoresistive sensing unit arrays as well as a flux concentrator form a Z-axis push-pull magnetoresistive sensor.

Optionally, the push-pull magnetoresistive sensor is a two-axis push-pull magnetoresistive sensor. For example, the magnetoresistive sensor is an X-Y two-axis push-pull magnetoresistive sensor which comprises+X, −X, +Y and −Y magnetoresistive sensing unit arrays. Alternatively, +X, −X, +Z and −Z magnetoresistive sensing unit arrays form an X-Z two-axis push-pull magnetoresistive sensor. Alternatively, the +Y, −Y, +Z and −Z magnetoresistive sensing unit arrays form a Y-Z two-axis push-pull magnetoresistive sensor.

Alternatively, the +X, −X, +Y and −Y magnetoresistive sensing unit arrays as well as a flux concentrator form a Z-axis compound push-pull magnetoresistive sensor.

Optionally, the push-pull magnetoresistive sensor is a three-axis push-pull magnetoresistive sensor. For example, the magnetoresistive sensor is an X-Y-Z three-axis push-pull magnetoresistive sensor which comprises+X, −X, +Y, −Y, +Z and −Z magnetoresistive sensing unit arrays.

In other embodiments, further optionally, the +Z and −Z magnetoresistive sensing unit arrays form a Z-axis push-pull magnetoresistive sensor, in which an anti-ferromagnetic layer in the magnetoresistive sensing units of the +Z magnetoresistive sensing unit array has a magnetization direction+Z, and an anti-ferromagnetic layer in the magnetoresistive sensing units of the −Z magnetoresistive sensing unit array has a magnetization direction −Z.

Figure 6:
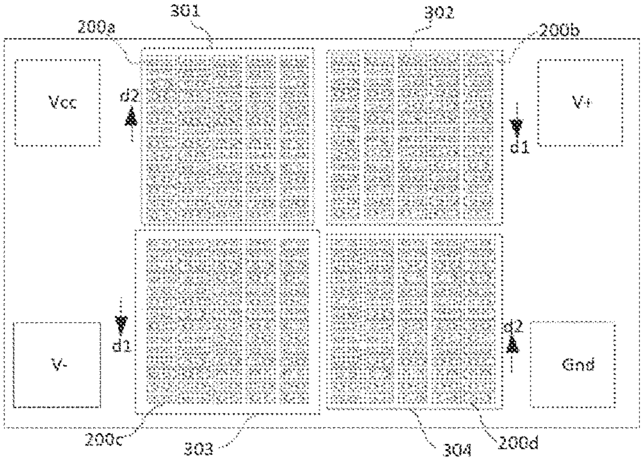
FIG. 6 is a schematic diagram of a single-axis push-pull magnetoresistive sensor according to an embodiment of the present invention.

Referring to FIG. 6, there is shown a schematic diagram of a single-axis push-pull magnetoresistive sensor according to an embodiment of the present invention. In the present embodiment, the single-axis magnetoresistive sensor comprises four electrodes namely Vcc, GND, V+ and V−electrodes, and further comprises four magnetoresistive sensing unit arrays 200*a* to 200*d* arranged in a **2*2 array, and anti-ferromagnetic layers of the four magnetoresistive sensing unit arrays 200***a* to 200*d* have two opposite magnetic moment directions d1 and d2. Among them, two magnetoresistive sensing unit arrays 200*a* and 200*d* arranged diagonally in the array serve as pull magnetoresistive sensing unit arrays, and the anti-ferromagnetic layers of the two arrays have the same magnetic moment direction d2; and two magnetoresistive sensing unit arrays 200*b* and 200*c* arranged diagonally in the array serve as push magnetoresistive sensing unit arrays, and the anti-ferromagnetic layers of the two arrays have the same magnetic moment direction d1. The single-axis magnetoresistive sensor further comprises push thermal control layers 302 and 303 respectively covering the two push magnetoresistive sensing unit arrays 200*b* and 200*c* and pull thermal control layers 301 and 304 respectively covering the two pull magnetoresistive sensing unit arrays 200*a* and 200*d*, and the push thermal control layers 302 and 303 and the pull thermal control layers 301 and 304 are all air layers.

In other embodiments, further optionally, the push magnetoresistive sensing unit arrays may be arranged in a same row or in a same column, and correspondingly, the pull magnetoresistive sensing unit arrays may be arranged in a same row or in a same column. Alternatively, further optionally, the push magnetoresistive sensing unit arrays and the pull magnetoresistive sensing unit arrays may form a **1*4 array or a 4*1** array, and the two push magnetoresistive sensing unit arrays may be arranged adjacently or crosswise.

FIG. 6 shows a die diagram of a single-axis magnetoresistive sensor. In other embodiments, further optionally, the magnetoresistive sensor is a two-axis magnetoresistive sensor which comprises: a push magnetoresistive sensing unit array with an anti-ferromagnetic layer having a magnetic moment direction d1, a pull magnetoresistive sensing unit array with an anti-ferromagnetic layer having a magnetic moment direction −d1, a push magnetoresistive sensing unit array with an anti-ferromagnetic layer having a magnetic moment direction d2, and a pull magnetoresistive sensing unit array with an anti-ferromagnetic layer having a magnetic moment direction −d2.

In other embodiments, further optionally, the magnetoresistive sensor is a three-axis magnetoresistive sensor which comprises: a push magnetoresistive sensing unit array with an anti-ferromagnetic layer having a magnetic moment direction d1, a pull magnetoresistive sensing unit array with an anti-ferromagnetic layer having a magnetic moment direction −d1, a push magnetoresistive sensing unit array with an anti-ferromagnetic layer having a magnetic moment direction d2, a pull magnetoresistive sensing unit array with an anti-ferromagnetic layer having a magnetic moment direction −d2, a push magnetoresistive sensing unit array with an anti-ferromagnetic layer having a magnetic moment direction d3, and a pull magnetoresistive sensing unit array with an anti-ferromagnetic layer having a magnetic moment direction −d3.

Among them, the magnetoresistive sensor has a full-bridge structure in each dimension, and correspondingly comprises 2 push magnetoresistive sensing unit arrays and 2 pull magnetoresistive sensing unit arrays. Alternatively, the magnetoresistive sensor has a half-bridge structure in each dimension, and correspondingly comprises 1 push magnetoresistive sensing unit array and 1 pull magnetoresistive sensing unit array. Alternatively, the magnetoresistive sensor has a quasi-bridge structure in each dimension, and correspondingly comprises 1 push magnetoresistive sensing unit array and 1 pull magnetoresistive sensing unit array. In practice, the magnetic moment may be written into the anti-ferromagnetic layer through a same scheme of laser writing for programming regardless of combined arrangement of the magnetoresistive sensor.

Based on the same inventive concept, the embodiments of the present invention provide a laser writing method for programming magnetoresistive devices implemented based on a laser writing system for programming, and the laser writing system for programming comprises a magnetic field generating apparatus and the laser writing apparatus for programming as described in any one of the above embodiments; and the laser writing method for programming of the laser writing system for programming comprises:

changing, in a phase of laser writing for programming, film layer parameters of the thermal control layer and/or the magnetoresistive sensor which comprise at least one of a film layer material and a film layer thickness; and adjusting a change rate of a temperature of the magnetoresistive sensor along with a laser power, and increasing or decreasing a temperature of writing into the magnetoresistive sensor at the same laser power.

Optionally, the magnetoresistive sensor is a push-pull magnetoresistive sensor, the push-pull magnetoresistive sensor comprises a group of push magnetoresistive sensing unit arrays and pull magnetoresistive sensing unit arrays, an anti-ferromagnetic layer of the push magnetoresistive sensing unit array has a magnetic moment direction+di, and an anti-ferromagnetic layer of the pull magnetoresistive sensing unit array has a magnetic moment direction −di, i is a positive integer and 1<i<3.

The laser writing method for programming further comprises: writing a magnetic moment into an anti-ferromagnetic layer of the push-pull magnetoresistive sensor which comprises writing the magnetic moment direction +di of the anti-ferromagnetic layer into the push magnetoresistive sensing unit array, and writing the magnetic moment direction −di of the anti-ferromagnetic layer into the pull magnetoresistive sensing unit array.

Optionally, writing the magnetic moment direction+di of the anti-ferromagnetic layer into the push magnetoresistive sensing unit array comprises:

setting a magnetic field annealing power to Poven and a temperature to Tw, and performing direction+di magnetic field thermal annealing on a wafer, so that the anti-ferromagnetic layer of each of the magnetoresistive sensing unit arrays has the magnetic moment direction+di; or setting the laser power to P(+di) and the temperature to Tdi, and generating a direction+di magnetic field to write the direction+di magnetic moment into the anti-ferromagnetic layer of the push magnetoresistive sensing unit array.

Optionally, writing the magnetic moment direction −di of the anti-ferromagnetic layer into the pull magnetoresistive sensing unit array comprises:

setting the magnetic field annealing power to Poven and the temperature to Tw, and performing direction −di magnetic field thermal annealing on the wafer, so that the anti-ferromagnetic layer of each of the magnetoresistive sensing unit arrays has the magnetic moment direction −di; or setting the laser power to P(−di) and the temperature to Tdi, and generating a direction −di magnetic field to write the direction −di magnetic moment into the anti-ferromagnetic layer of the pull magnetoresistive sensing unit array.

Optionally, Td1<Td2<Td3.

Optionally, Tb<Tdl<Td2<Td3<Td, where the Tb is a writing temperature of the magnetoresistive sensing unit array, and the Td is a damage temperature of the magnetoresistive sensing unit array. It is to be understood that d1, d2 and d3 represent any one of x, y and z axes and comprise axial directions that are positive and negative to each other.

Figure 7A:
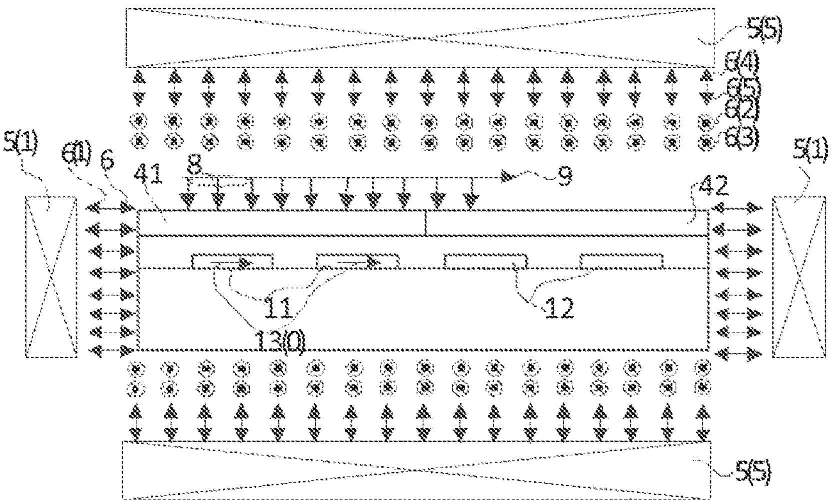
FIG. 7A is a schematic diagram of laser writing for programming a push-pull magnetoresistive sensor.

A three-axis magnetic field writing system namely a laser writing system for programming is as shown in FIG. 7A. The system comprises an X-axis coil 5(1) for generating an X magnetic field 6 and a −X magnetic field 6(1), a Z-axis coil 5(5) for generating a Z magnetic field 6(4) and a −Z magnetic field 6(5), a Y-axis coil for generating a Y magnetic field 6(2) and a −Y magnetic field 6(3), a d1 push/pull magnetoresistive sensing unit array 11 having a magnetic moment direction d1, and an adjacent d2 push/pull magnetoresistive sensing unit array 12 having a magnetic moment direction d2, with corresponding 41 and 42 being a d1 push/pull thermal control layer and a d2 push/pull thermal control layer respectively.

Figure 7B:
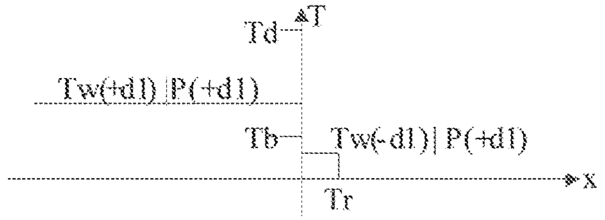
FIG. 7B is a temperature profile of FIG. 7A.

During laser writing for programming, a laser spot 8 is written on surfaces of the thermal control layers 41 and 42 along a direction 9, so that the d1 push/pull magnetoresistive sensing unit array 11 is written into a magnetic field 13(0); and a temperature of the writing process is as shown in FIG. 7B. When writing into the d1 push/pull magnetoresistive sensing unit array at a laser power P(+d1), magnetoresistive sensing units thereof have a temperature Tw(d1)|P(+d1), where Tw is between a blocking temperature Tb of the anti-ferromagnetic (AF) layer and a damage temperature Td of the magnetoresistive sensing units. The magnetic field generating apparatus is switched on to generate a direction d1 magnetic field, so that the magnetic moment can be written into the anti-ferromagnetic layer during cooling.

Furthermore, since there is no need to use a large-interval thermal isolation (>50 um) between adjacent d2 magnetoresistive sensing units and a d1 magnetoresistive sensing unit array, the adjacent d2 magnetoresistive sensing units have an opportunity to be heated at a temperature Tw(d2)|P(+d1). The temperature depends on thermal conductivity of the d2 magnetoresistive sensing units and the d1 magnetoresistive sensing units, optionally is lower than Tb, and actually may be between Tb and Td. Based on this, optionally, the laser has a wavelength in the range of 100 nm to 3000 nm, which can meet the design of scanning sequence of laser writing for programming and the thermal conductivity between the magnetoresistive sensing unit arrays.

Illustratively, writing magnetic moment directions+d and −d of an anti-ferromagnetic layer of a single-axis push-pull magnetoresistive sensor may comprise two steps: 1) writing the magnetic moment direction+d of the anti-ferromagnetic layer in a +d push magnetoresistive sensing unit array; and 2) writing the magnetic moment direction −d of the anti-ferromagnetic layer in a −d pull magnetoresistive sensing unit array.

Figure 8A:
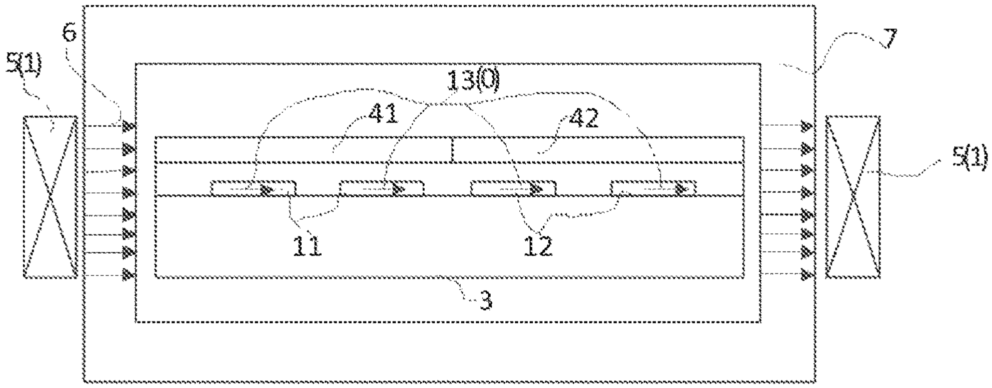
FIG. 8A is a schematic diagram of a+d magnetic moment in a single-axis push-pull magnetoresistive sensor written during thermal annealing.
Figure 8B:
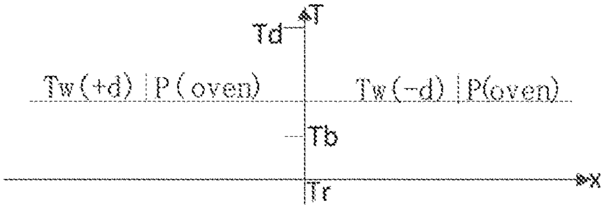
FIG. 8B is a temperature profile of FIG. 8A.

Optionally, 1) writing the magnetic moment direction+d of the anti-ferromagnetic layer in the +d push magnetoresistive sensing unit array comprises the following 3 methods:

Method1: As shown in FIG. 8A, a single-axis push-pull magnetoresistive sensor is placed in a magnetic field annealing oven 7, a thermal power of the magnetic field annealing oven 7 is set to Poven and a temperature is set to Tw, a magnetic field generating apparatus 5(1) is used to generate a direction+d magnetic field 6, and a wafer is subject to direction+d magnetic thermal annealing, so that a +d push magnetoresistive sensing unit array 11 and a −d pull magnetoresistive sensing unit array 12 located on a substrate 3 obtain a direction +d magnetic moment 13(0), and a push thermal control layer 41 and a pull thermal control layer 42 do not function, at this point, a temperature profile of the single-axis push-pull magnetoresistive sensor is as shown in FIG. 8B, with Tw(+d)|P(oven)=Tw(−d)|P(oven), that is, a temperature rise Tw(+d)|P(oven) of the +d push magnetoresistive sensing unit array 11 equals a temperature rise Tw(−d)|P(oven) of the −d pull magnetoresistive sensing unit array 12, and a temperature of the magnetoresistive sensing unit arrays is between Tb and Td.

Figure 9A:
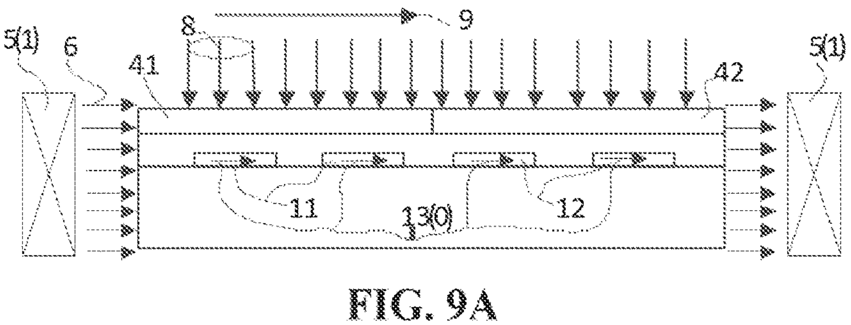
FIG. 9A is a schematic diagram of a+d magnetic moment in a single-axis push-pull magnetoresistive sensor written during global laser programming.
Figure 9B:
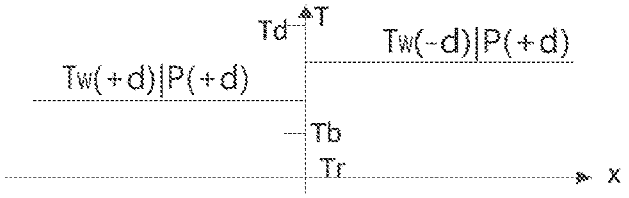
FIG. 9B is a temperature profile of FIG. 9A.

Method II: As shown in FIG. 9A, a single-axis push-pull magnetoresistive sensor is placed in a magnetic field generating apparatus 5(1), the magnetic field generating apparatus 5(1) generates a direction+d magnetic field 6, and a laser power of the magnetic field generating apparatus 5(1) is set to P (+d) and a temperature is set to Tw, then a laser spot 8 generated by the magnetic field generating apparatus 5(1) scans a +d push magnetoresistive sensing unit array 11 and a −d pull magnetoresistive sensing unit array 12 along a direction 9, so that each magnetoresistive sensing unit array located on a substrate 3 is written into the direction+d magnetic field 13(0), and a push thermal control layer 41 and a pull thermal control layer 42 do not function; at this point, a temperature profile of the single-axis push-pull magnetoresistive sensor is as shown in FIG. 9B, with Tb<Tw(+d)|P(+d)<Tw(−d)|P(+d)<Td, that is, under the action of the same laser power P(+d), a temperature rise Tw(+d)|P(+d) of the +d push magnetoresistive sensing unit array 11 is slower than a temperature rise Tw(−d)|P(+d) of the −d pull magnetoresistive sensing unit array 12, and a temperature of the magnetoresistive sensing unit arrays is between Tb and Td.

Figure 10A:
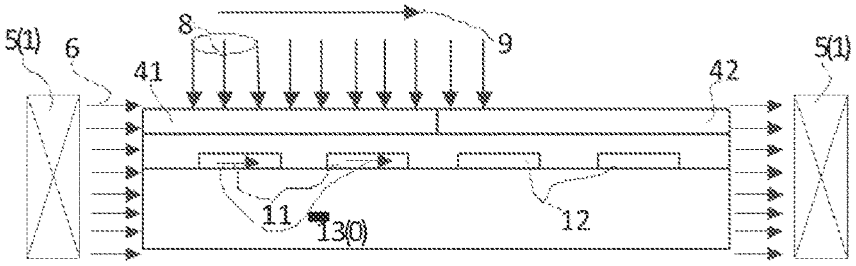
FIG. 10A is a schematic diagram of a+d magnetic moment in a single-axis push-pull magnetoresistive sensor written during local laser programming.
Figure 10B:
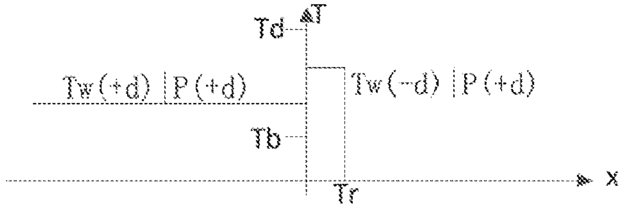
FIG. 10B is a temperature profile of FIG. 10A.

Method III: As shown in FIG. 10A, a single-axis push-pull magnetoresistive sensor is placed in a magnetic field generating apparatus 5(1), the magnetic field generating apparatus 5(1) generates a direction+d magnetic field 6, and a laser power of the magnetic field generating apparatus 5(1) is set to P(+d) and a temperature is set to Tw, then a laser spot 8 generated by the magnetic field generating apparatus 5(1) scans a +d push magnetoresistive sensing unit array 11 along a direction 9, so that the +d push magnetoresistive sensing unit array 11 located on a substrate 3 is written into a direction+d magnetic field 13(0), and a push thermal control layer 41 and a pull thermal control layer 42 do not function; at this point, a temperature profile of the single-axis push-pull magnetoresistive sensor is as shown in FIG. 12, the +d push magnetoresistive sensing unit array 11 has a temperature rise Tw(+d)|P(+d), and a −d pull magnetoresistive sensing unit array 12 has a temperature rise Tw(−d)|P(+d) which is the room temperature Tr.

Figure 11A:
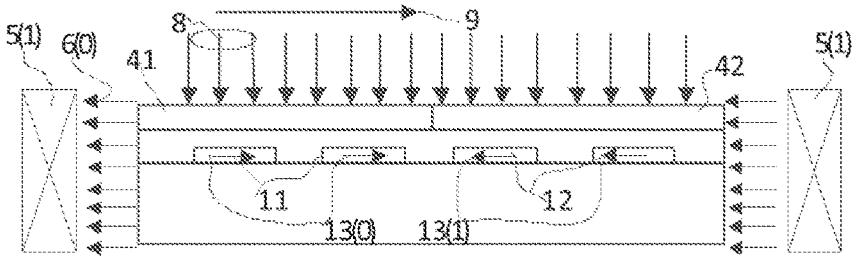
FIG. 11A is a schematic diagram of a−d magnetic moment in a single-axis push-pull magnetoresistive sensor written during global laser programming.
Figure 11B:
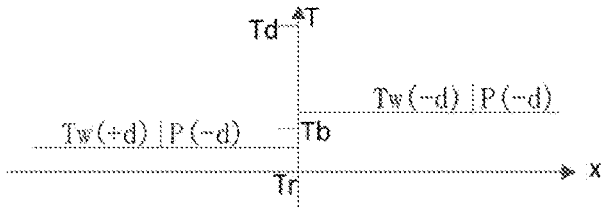
FIG. 11B is a temperature profile of FIG. 11A.

Optionally, 2) writing the magnetic moment direction −d of the anti-ferromagnetic layer in the −d pull magnetoresistive sensing unit array comprises the following 3 methods:

Method I: As shown in FIG. 11A, a laser spot 8 scans a +d push magnetoresistive sensing unit array 11 and a −d pull magnetoresistive sensing unit array 12 along a direction 9; if a laser power of a magnetic field generating apparatus 5(1) is set to P(−d) and a temperature is set to Tw, then the magnetic field generating apparatus 5(1) generates a direction −d magnetic field 6(0), the −d pull magnetoresistive sensing unit array 12 is written into a direction −d magnetic field 13(1); at this point, as shown in FIG. 11B, in a temperature profile of the single-axis push-pull magnetoresistive sensor, Tr<Tw(+d)|P(−d)<Tb<Tw(−d)|P(−d)<Td, where Tr is the room temperature, the +d pull magnetoresistive sensing unit array 11 has a temperature rise Tw(+d)|P(−d), and the −d pull magnetoresistive sensing unit array 12 has a temperature rise Tw(−d)|P(−(1).

Figure 12A:
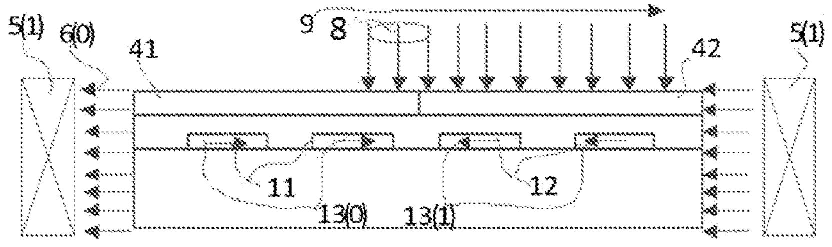
FIG. 12A is a schematic diagram of a−d magnetic moment in a single-axis push-pull magnetoresistive sensor written during local laser programming.
Figure 12B:
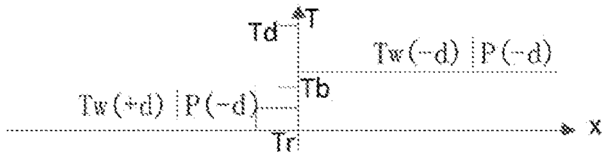
FIG. 12B is a temperature profile of FIG. 12A.

Method H. As shown in FIG. 12A, a laser spot 8 scans a −d pull magnetoresistive sensing unit array 12 along a direction 9; if a laser power of a magnetic field generating apparatus 5(1) is set to P(−d) and a temperature is set to Tw, then the magnetic field generating apparatus 5(1) generates a direction −d magnetic field 6(0), the −d pull magnetoresistive sensing unit array 12 is written into a direction −d magnetic field 13(1), and a magnetic moment of an adjacent+d push magnetoresistive sensing unit array 11 is not affected; and a temperature profile thereof is as shown in FIG. 12B, with Tr<Tw(+d)|P(−d)<Tb<Tw(−d)P(−d)<Td, a temperature thereof is maintained at Tw(+d)|P(−d), and the −d pull magnetoresistive sensing unit array 12 has a temperature rise Tw(−d)|P(−d), where Tr is the room temperature.

Illustratively, writing magnetic moment directions+d and −d of an anti-ferromagnetic layer of a two-axis push-pull magnetoresistive sensor may comprise four steps: 1) writing a magnetic moment direction+d1 of an anti-ferromagnetic layer in a +d1 push magnetoresistive sensing unit array; 2) writing a magnetic moment direction −d1 of an anti-ferromagnetic layer in a −d1 pull magnetoresistive sensing unit array; 3) writing a magnetic moment direction+d2 of an anti-ferromagnetic layer in a +d2 push magnetoresistive sensing unit array; and 4) writing a magnetic moment direction −d2 of an anti-ferromagnetic layer in a −d2 pull magnetoresistive sensing unit array.

Figure 13A:
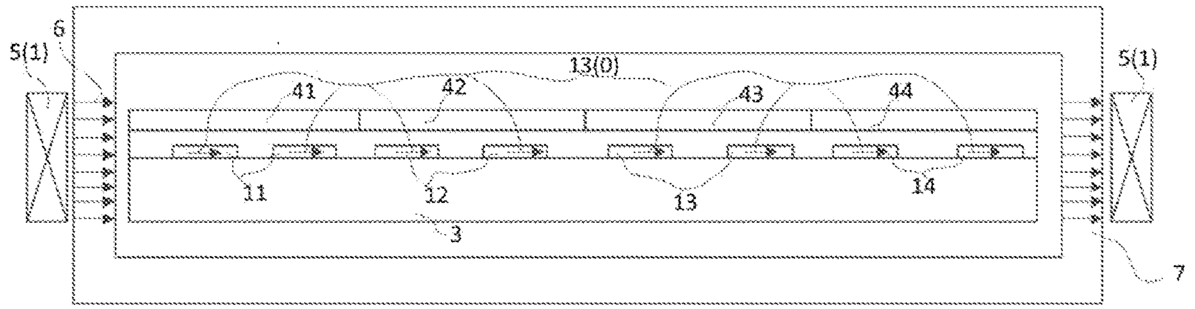
FIG. 13A is a schematic diagram of a+d1 magnetic moment in a two-axis push-pull magnetoresistive sensor written during thermal annealing.
Figure 13B:
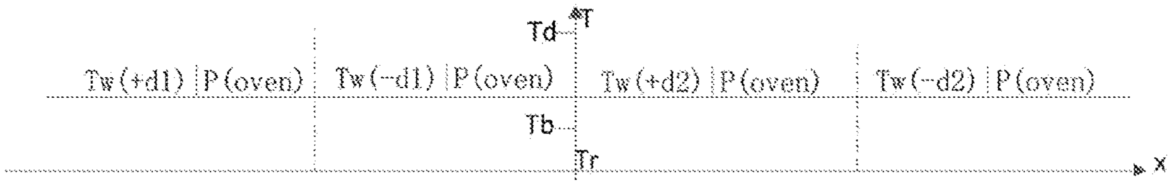
FIG. 13B is a temperature profile of FIG. 13A.

Optionally, 1) writing the magnetic moment direction+d1 of the anti-ferromagnetic layer in the +d1 push magnetoresistive sensing unit array comprises the following 3 methods:

Method I: As shown in FIG. 13A, a magnetic field annealing oven 7 is used, a thermal power of the magnetic field annealing oven 7 is set to Poven and a temperature is set to Tw, and a magnetic field generating apparatus 5(1) thereof is used to generate a direction+d1 magnetic field 6, so that a +d1 push magnetoresistive sensing unit array 11 and a −d1 pull magnetoresistive sensing unit array 12 as well as a +d2 push magnetoresistive sensing unit array 13 and a −d2 pull magnetoresistive sensing unit array 14 which are located on a substrate 3 obtain a direction+d1 magnetic moment 13(0), and a +d1 push thermal control layer 41, a −d1 pull thermal control layer 42, a +d2 push thermal control layer 43 and a −d2 thermal control layer 44 do not function; a temperature profile thereof is as shown in FIG. 13B; and the +d1 push magnetoresistive sensing unit array 11 has a temperature rise Tw(+d1)|P(oven), the −d1 pull magnetoresistive sensing unit array 12 has a temperature rise Tw(−d1)|P(oven), the +d2 push magnetoresistive sensing unit array 13 has a temperature rise Tw(+d2)|P(oven), and the −d2 pull magnetoresistive sensing unit array 14 has a temperature rise Tw(−d2)|P(oven), which satisfy a relationship: Tb<Tw(+d1)|P(oven)=Tw(−d1)|P(oven)=Tw(+d2)|P(oven)=Tw(−d2)|P(oven)<Td, and a temperature of the magnetoresistive sensing unit arrays is between Tb and Td.

Figure 14A:
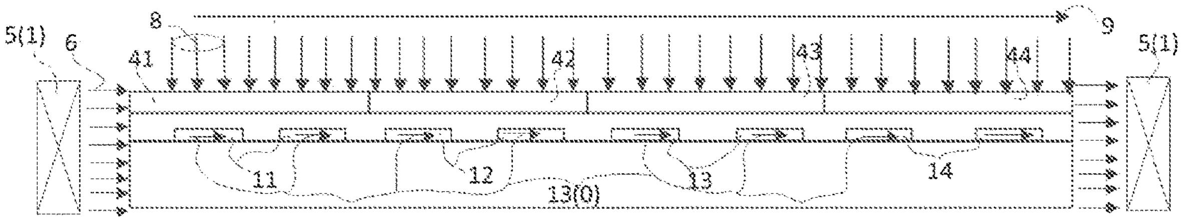
FIG. 14A is a schematic diagram of a+d1 magnetic moment in a two-axis push-pull magnetoresistive sensor written during global laser programming.
Figure 14B:
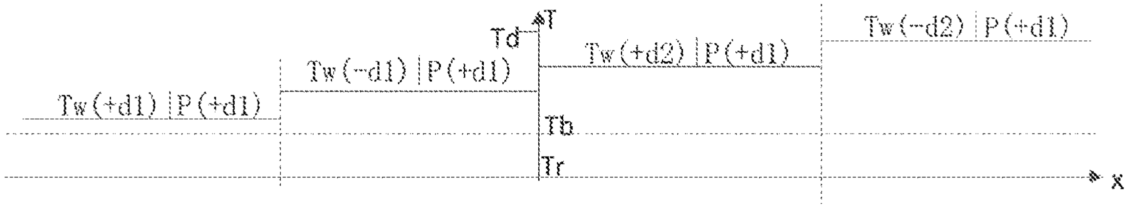
FIG. 14B is a temperature profile of FIG. 14A.
Figure 15A:
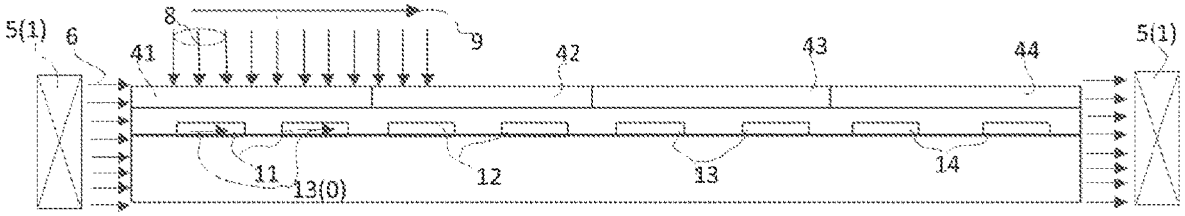
FIG. 15A is a schematic diagram of a+d1 magnetic moment in a two-axis push-pull magnetoresistive sensor written during local laser programming.
Figure 15B:
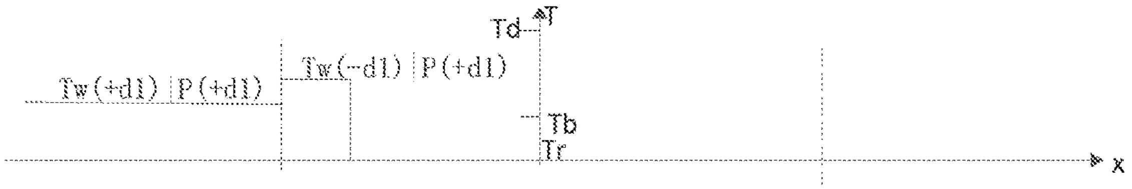
FIG. 15B is a temperature profile of FIG. 15A.

Method II: As shown in FIG. 14A, a magnetic field generating apparatus 5(1) generates a direction+d1 magnetic field 6; if a laser power of the magnetic field generating apparatus 5(1) is set to P(+d1) and a temperature is set to Tw, then a laser spot 8 generated by the magnetic field generating apparatus 5(1) scans+d1 and +d2 push magnetoresistive sensing unit arrays 11 and 13 and −d1 and −d2 pull magnetoresistive sensing unit arrays 12 and 14 along a direction 9; if the magnetic field generating apparatus 5(1) generates the direction+d1 magnetic field 6, then all the magnetoresistive sensing unit arrays 11 to 14 are written into a direction +d1 magnetic field 13(0); and a temperature profile thereof is as shown in FIG. 14B, with Tb<Tw(+d1)|P(+d1)<T(−d1)|P(+d1)<Tw(+d2)|P(+d1)<Tw(−d2)|P(+d1)<Td, that is, under the action of the same laser power P(+d1), a temperature rise Tw(+d1)|P(+d1) of the +d1 push magnetoresistive sensing unit array 11, a temperature rise Tw(−d1)|P(+d1) of the −d1 pull magnetoresistive sensing unit array 12, a temperature rise Tw(+d2)|P(+d1) of the +d2 push magnetoresistive sensing units 13 and a temperature rise Tw(−d2)|P(+d1) of the −d2 pull magnetoresistive sensing units 14 are arranged in order from slow to fast. Method III: As shown in FIG. 15A, if a laser spot 8 scans a +d1 push magnetoresistive sensing unit array 11 along a direction 9, a magnetic field generating apparatus 5(1) generates a direction+d1 magnetic field 6, the +d1 push magnetoresistive sensing unit array 11 is written into a direction+d1 magnetic field 13(0), and a temperature profile thereof is as shown in FIG. 15B; the +d1 push magnetoresistive sensing unit array 11 has a temperature Tw(+d1)|P(+d1), an adjacent −d1 pull magnetoresistive sensing unit array 12 has a temperature Tw(−d1)fP(+d1), and Tw(+d1)|P(+d1) is slower than Tw(−d1)|P(+d1), which may result in magnetic moment writing into magnetoresistive sensing units.

Figure 16A:
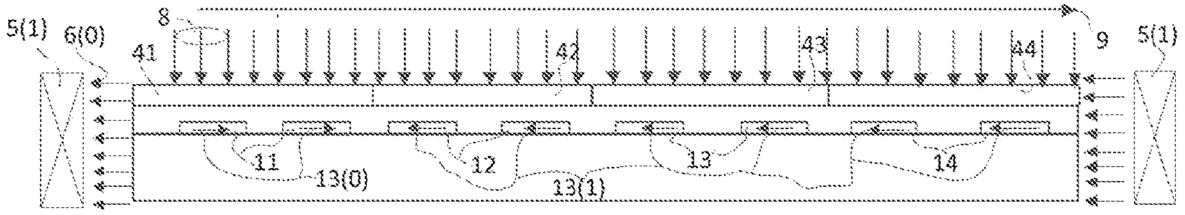
FIG. 16A is a schematic diagram of −d1 magnetic moment in a two-axis push-pull magnetoresistive sensor written during global laser programming.
Figure 16B:
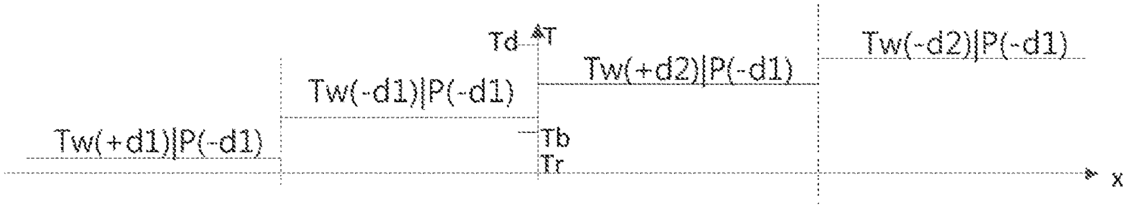
FIG. 16B is a temperature profile of FIG. 16A.

Optionally, 2) writing the magnetic moment direction −d1 of the anti-ferromagnetic layer in the −d1 pull magnetoresistive sensing unit array comprises the following 2 methods:

Method I. As shown in FIG. 16A, a laser spot 8 scans a +d1 push magnetoresistive sensing unit array 11 and a −d1 pull magnetoresistive sensing unit array 12 as well as a +d2 push magnetoresistive sensing unit array 13 and a −d2 pull magnetoresistive sensing unit array 14 along a direction 9, and a magnetic field generating apparatus 5(1) generates a direction −d1 magnetic field 6(0), where the −d1 pull magnetoresistive sensing unit array 12, the +d2 push magnetoresistive sensing unit array 13 and the −d2 pull magnetoresistive sensing unit array 14 are all written into a direction −d1 magnetic field 13(1); and a temperature profile of the magnetoresistive sensor is as shown in FIG. 16B, with Tr<Tw(+d1)|P(−d1)<Tb<Tw(−d1)|P(−d1)<Tw(+d2)P(−d1)<Tw(−d2)|P(−d1)<Td.

Figure 17A:
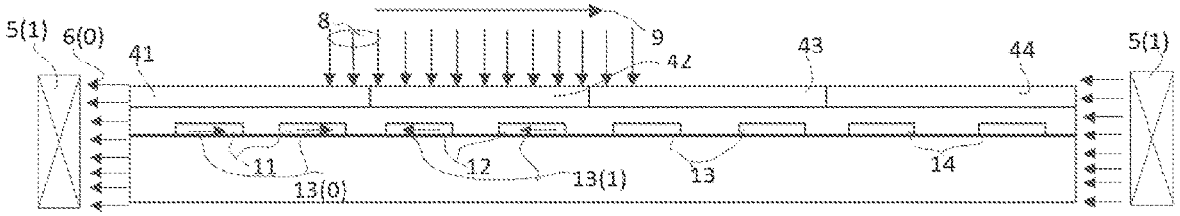
FIG. 17A is a schematic diagram of a−d1 magnetic moment in a two-axis push-pull magnetoresistive sensor written during local laser programming.
Figure 17B:
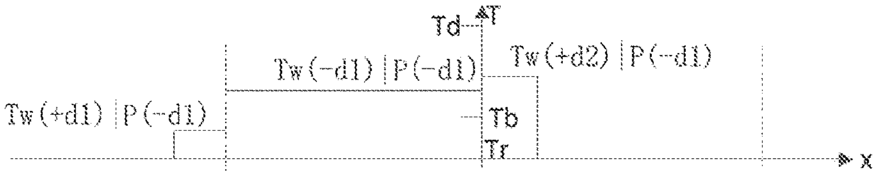
FIG. 17B is a temperature profile of FIG. 17A.

Method II: As shown in FIG. 17A, a laser spot 8 scans a −d1 pull magnetoresistive sensing unit array 12 along a direction 9; and if a magnetic field generating apparatus 5(1) generates a direction −d1 magnetic field 6(0), then only the −d1 pull magnetoresistive sensing unit array 12 is written into a direction −d1 magnetic field 13(1), a magnetic moment of an adjacent+d1 push magnetoresistive sensing unit array 11 is not affected, and a magnetic moment of an adjacent+d2 push magnetoresistive sensing unit array 13 may be affected; and temperature profile thereof is as shown in FIG. 17B, with Tr<Tw(+d1)|P(−d1)<Tb<Tw(−d1)|P(−d1)<Tw(+d2)|P(−d1)<Td.

Figure 18A:
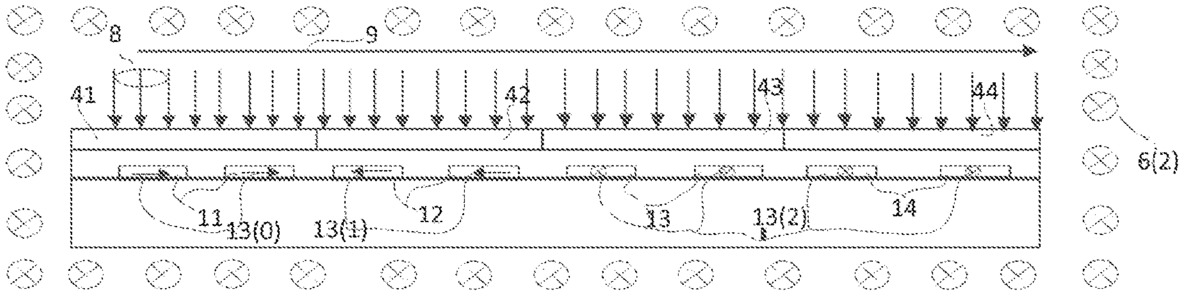
FIG. 18A is a schematic diagram of a+d2 magnetic moment in a two-axis push-pull magnetoresistive sensor written during global laser programming.
Figure 18B:
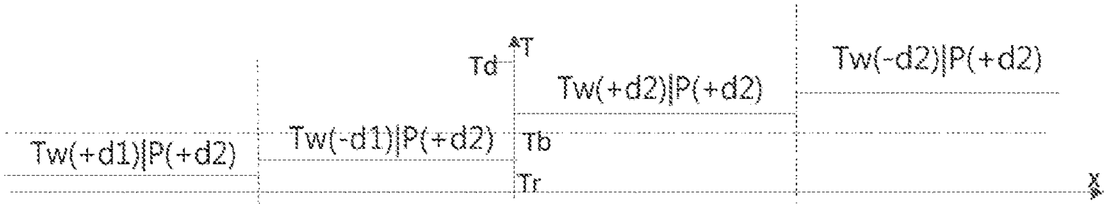
FIG. 18B is a temperature profile of FIG. 18A.

Optionally, 3) writing the magnetic moment direction+d2 of the anti-ferromagnetic layer in the +d2 push magnetoresistive sensing unit array comprises the following 2 methods:

Method I: As shown in FIG. 18A, a laser spot 8 scans a +d1 push magnetoresistive sensing unit array 11 and a −d1 pull magnetoresistive sensing unit array 12 as well as a +d2 push magnetoresistive sensing unit array 13 and a −d2 pull magnetoresistive sensing unit array 14 along a direction 9, a magnetic field generating apparatus (not marked here) generates a direction+d2 magnetic field 6(2), and only the +d2 push magnetoresistive sensing unit array 13 and the −d2 pull magnetoresistive sensing unit array 14 are written into a direction+d2 magnetic field 13(2); and a temperature profile of the magnetoresistive sensor is as shown in FIG. 18B, with Tr<Tw(+d1)|P(+d2)<Tw(−d1)|P(+d2)<Tb<Tw(+d2)|P(+d2)<Tw(−d2)|P(+d2)<Td.

Figure 19A:
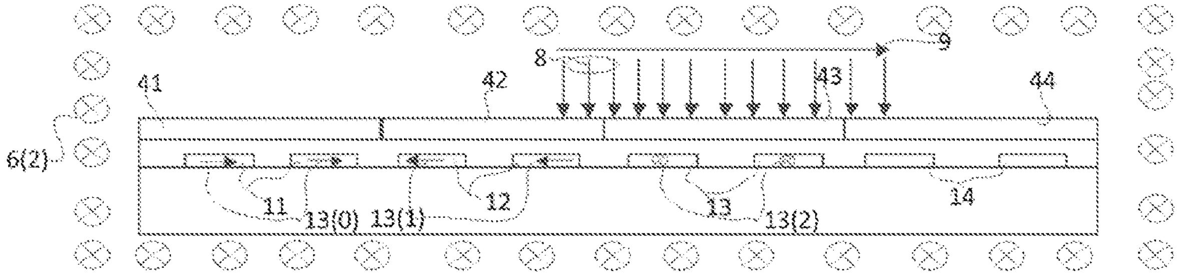
FIG. 19A is a schematic diagram of a+d2 magnetic moment in a two-axis push-pull magnetoresistive sensor written during local laser programming.
Figure 19B:
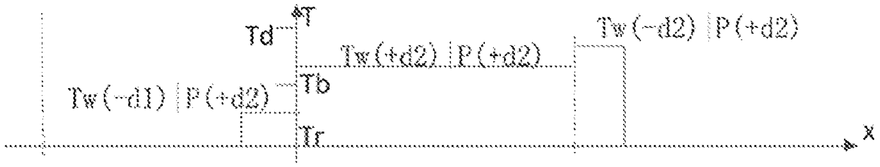
FIG. 19B is a temperature profile of FIG. 19A.

Method II. As shown in FIG. 19A, a laser spot 8 scans a +d2 push magnetoresistive sensing unit array 13 along a direction 9, a magnetic field generating apparatus generates a direction+d2 magnetic field 6(2), only the +d2 push magnetoresistive sensing unit array 13 is written into a direction+d2 magnetic field 13(2), a magnetic moment of an adjacent −d1 pull magnetoresistive sensing unit array 12 is not affected, and a magnetic moment of an adjacent-d2 pull magnetoresistive sensing unit array 14 is affected; and a temperature profile is as shown in FIG. 19B, with Tr<Tw(−d1)|P(+d2)<Tb<Tw(+d2)|P(+d2)<Tw(−d2)|P(+d2)<Td.

Figure 20A:
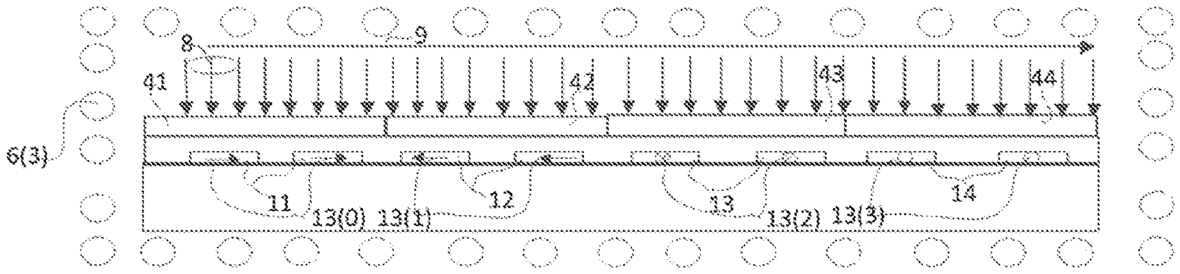
FIG. 20A is a schematic diagram of a−d2 magnetic moment in a two-axis push-pull magnetoresistive sensor written during global laser programming.
Figure 20B:
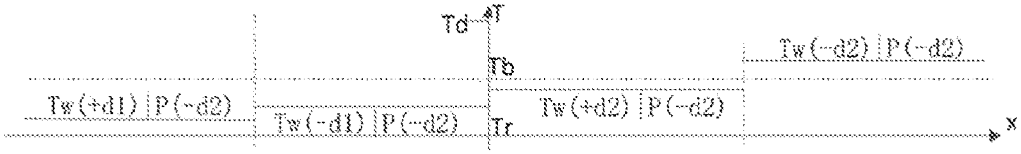
FIG. 20B is a temperature profile of FIG. 20A.

Optionally, 4) writing the magnetic moment direction −d2 of the anti-ferromagnetic layer in the −d2 pull magnetoresistive sensing unit array comprises the following 2 methods:

Method I: As shown in FIG. 20A, a laser spot 8 scans a +d1 push magnetoresistive sensing unit array 11 and a −d1 pull magnetoresistive sensing unit array 12 as well as a +d2 push magnetoresistive sensing unit array 13 and a −d2 pull magnetoresistive sensing unit array 14 along a direction 9, a magnetic field generating apparatus (not marked here) generates a direction −d2 magnetic field 6(3), and only the −d2 pull magnetoresistive sensing unit array 14 is written into a direction −d2 magnetic field 13(3); and a temperature profile thereof is as shown in FIG. 20B, with Tr<Tw(+d1)P(−d2)<Tw(−d1)|P(−d2)<Tw(+d2)|P(−d2)<Tb<Tw(−d2)P(−d2)<Td.

Figure 21A:
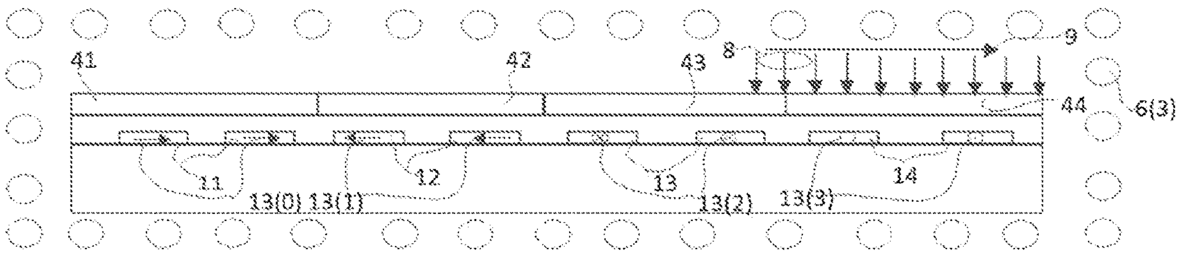
FIG. 21A is a schematic diagram of a−d2 magnetic moment in a two-axis push-pull magnetoresistive sensor written during local laser programming.
Figure 21B:
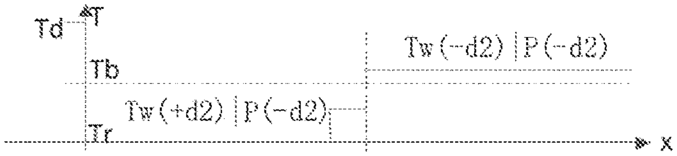
FIG. 21B is a temperature profile of FIG. 21A.

Method II: As shown in FIG. 21A, a laser spot 8 scans along a −d2 pull magnetoresistive sensing unit array 14 along a direction 9, 2 magnetic field generating apparatuses generate a direction −d2 magnetic field 6(3), a direction−d2 magnetic moment 13(3) is written into the −d2 pull magnetoresistive sensing unit array 14 only, a magnetic moment of an adjacent+d2 push magnetoresistive sensing unit array 13 is not affected, and a temperature profile thereof is as shown in FIG. 21B, with Tr<Tw(+d2)|P(−d2)<Tb<Tw(−d2)|P(−d2)<Td.

Illustratively, writing magnetic moment directions+d and −d of an anti-ferromagnetic layer of a three-axis push-pull magnetoresistive sensor may comprise six steps: 1) writing a magnetic moment direction+d1 of an anti-ferromagnetic layer in a +d1 push magnetoresistive sensing unit array; 2) writing a magnetic moment direction −d1 of an anti-ferromagnetic layer in a −d1 pull magnetoresistive sensing unit array; 3) writing a magnetic moment direction+d2 of an anti-ferromagnetic layer in a +d2 push magnetoresistive sensing unit array; 4) writing a magnetic moment direction −d2 of an anti-ferromagnetic layer in a −d2 pull magnetoresistive sensing unit array; 5) writing a magnetic moment direction+d3 of an anti-ferromagnetic layer in a +d3 push magnetoresistive sensing unit array; and 6) writing a magnetic moment direction −d3 of an anti-ferromagnetic layer in a −d3 pull magnetoresistive sensing unit array.

Figure 22A:
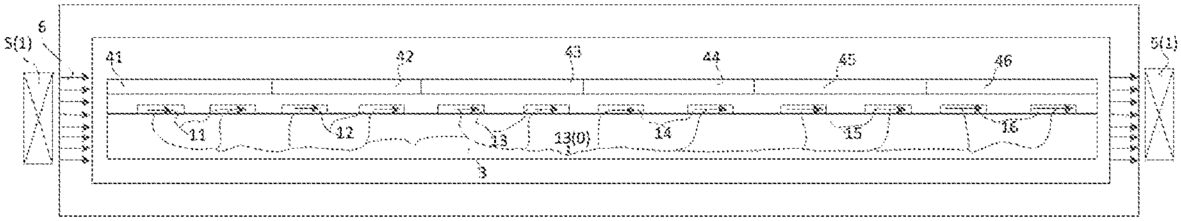
FIG. 22A is a schematic diagram of a+d1 magnetic moment in a three-axis push-pull magnetoresistive sensor written during thermal annealing.
Figure 22B:
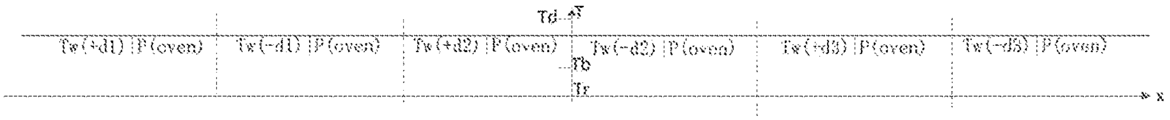
FIG. 22B is a temperature profile of FIG. 22A.

Optionally, 1) writing the magnetic moment direction+d1 of the anti-ferromagnetic layer in the +d1 push magnetoresistive sensing unit array comprises the following 3 methods:

Method I: As shown in FIG. 22A, a magnetic field annealing oven 7 is used, and a magnetic field generating apparatus 5(1) thereof is used to generate a direction+d1 magnetic field 6; a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 which are located on a substrate 3 all obtain a direction+d1 magnetic moment 13(0); a +d1 push thermal control layer 41 and a −d1 pull thermal control layer 42, a +d2 push thermal control layer 43 and a −d2 thermal control layer 44 as well as a +d3 push thermal control layer 45 and a −d3 thermal control layer 46 do not function; and a temperature profile is as shown in FIG. 22B, with Tb<Tw(+d1)|P(oven)=Tw(−d1)|P(oven)=Tw(+d2)|P(oven)=Tw(−d2)|P(ovenTw(+d3)|P(oven)=Tw(−d3)|P(oven)<Td.

Figure 23A:
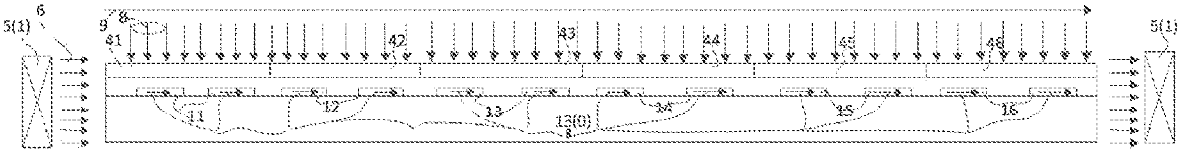
FIG. 23A is a schematic diagram of a+d1 magnetic moment in a three-axis push-pull magnetoresistive sensor written during global laser programming.
Figure 23B:
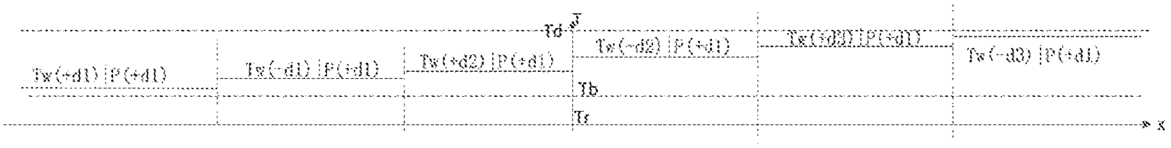
FIG. 23B is a temperature profile of FIG. 23A.

Method II: As shown in FIG. 23A, a laser spot 8 scans a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 along a direction 9, a magnetic field generating apparatus 5(1) generates a direction+d1 magnetic field 6, and a direction+d1 magnetic moment 13(0) is written into all magnetoresistive sensing units; and a temperature profile thereof is as shown in FIG. 23B, with Tb<Tw(+d1)|P(+d1)<Tw(−d1)|P(+d1)<Tw(+d2)|P(+d1)<Tw(−d2)|P(+d1)<Tw(+d3)|P(+d1)<Tw(−d3)|P(+d1)<Td, that is, under the action of a same laser power P(+d1), a temperature rise Tw(+d1)|P(+d1) of the +d1 push magnetoresistive sensing unit, a temperature rise Tw(−d1)|P(+d1) of the −d1 pull magnetoresistive sensing unit, a temperature rise Tw(+d2)|P(+d1) of the +d2 push magnetoresistive sensing unit, a temperature rise Tw(−d2)|P(+d1) of the −d2 pull magnetoresistive sensing unit, a temperature rise Tw(+d3)|P(+d1) of the +d3 push magnetoresistive sensing unit and a temperature rise Tw(−d3)|P(+d1) of the −d3 pull magnetoresistive sensing unit are arranged in order from slow to fast.

Figure 24A:
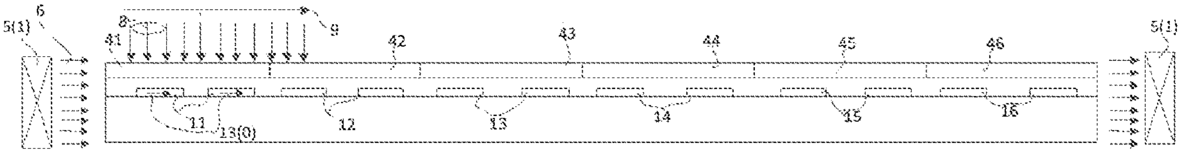
FIG. 24A is a schematic diagram of a+d1 magnetic moment in a three-axis push-pull magnetoresistive sensor written during local laser programming.
Figure 24B:
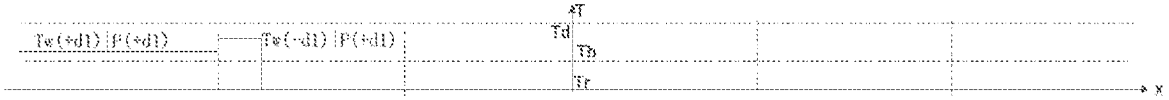
FIG. 24B is a temperature profile of FIG. 24A.

Method III: As shown in FIG. 24A, a laser spot 8 scans a +d1 push magnetoresistive sensing unit array 11 along a direction 9, a magnetic field generating apparatus 5(1) generates a direction+d1 magnetic field 6, and the +d1 push magnetoresistive sensing unit array 11 is written into a direction+d1 magnetic field 13(0); and as shown in FIG. 24B; the +d1 push magnetoresistive sensing unit array 11 has a temperature Tw(+d1)|P(+d1), and an adjacent −d1 pull magnetoresistive sensing unit array 12 has a temperature Tw(−d1)|P(+d1), which may result in magnetic moment writing into other magnetoresistive sensing units.

Figure 25A:
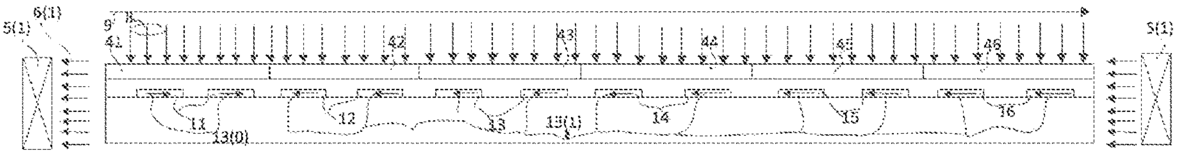
FIG. 25A is a schematic diagram of a−d1 magnetic moment in a three-axis push-pull magnetoresistive sensor written during global laser programming.
Figure 25B:
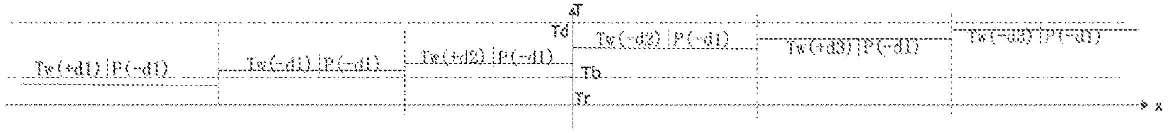
FIG. 25B is a temperature profile of FIG. 25A.

Optionally, 2) writing the magnetic moment direction −d1 of the anti-ferromagnetic layer in the −d1 pull magnetoresistive sensing unit array comprises the following 2 methods:

Method I: As shown in FIG. 25A, a laser spot 8 scans a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 along a direction 9, a magnetic field generating apparatus 5(1) generates a direction −d1 magnetic field 6(1), and only the −d1 pull magnetoresistive sensing unit array 12, the +d2 push magnetoresistive sensing unit array 13, the −d2 pull magnetoresistive sensing unit array 14, the +d3 push magnetoresistive sensing unit array 15 and the −d3 pull magnetoresistive sensing unit array 16 are all written into a direction −d1 magnetic field 13(1); and a temperature profile thereof is as shown in FIG. 25B, with Tr<Tw(+d1)|P(−d1)<Tb<Tw(−d1)|P(−d1)<Tw(+d2)|P(−d1)<Tw(−d2)P(−d1)<Tw(+d3)|P(−d1)<Tw(−d3)|P(−d1)<Td.

Figure 26A:
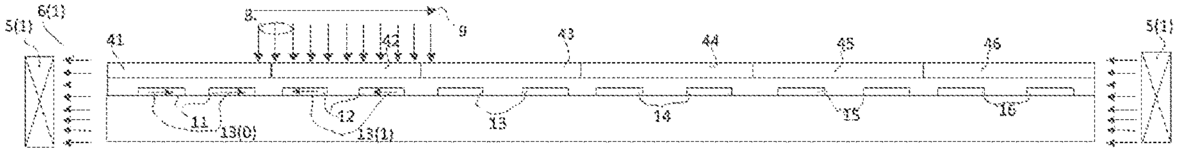
FIG. 26A is a schematic diagram of a−d1 magnetic moment in a three-axis push-pull magnetoresistive sensor written during local laser programming.
Figure 26B:
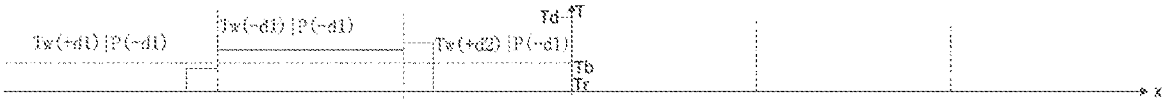
FIG. 26B is a temperature profile of FIG. 26A.

Method II: As shown in FIG. 26A, a laser spot 8 scans a −d1 pull magnetoresistive sensing unit array 12 along a direction 9, a magnetic field generating apparatus 5(1) generates a direction −d1 magnetic field 6(1), only the −d1 pull magnetoresistive sensing unit array 12 is written into a direction −d1 magnetic field 13(1), a magnetic moment of an adjacent+d1 push magnetoresistive sensing unit array 11 is not affected, and a magnetic moment of an adjacent+d2 push magnetoresistive sensing unit array 13 is affected; and a temperature profile thereof is as shown in FIG. 26B, with Tr<Tw(+d1)|P(−d1)<Tb<Tw(−d1)|P(−d1)<Tw(+d2)|P(−d1)<Td.

Figure 27A:
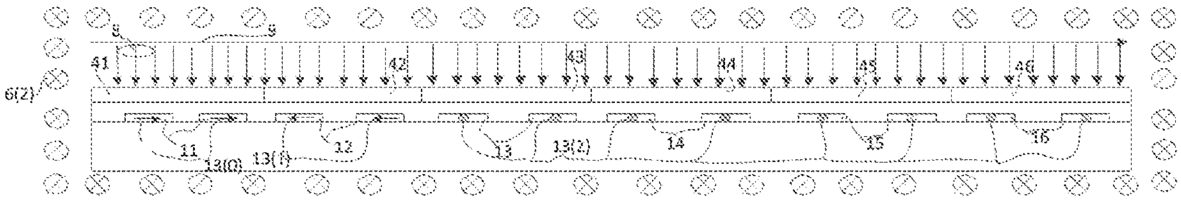
FIG. 27A is a schematic diagram of a+d2 magnetic moment in a three-axis push-pull magnetoresistive sensor written during global laser programming.
Figure 27B:
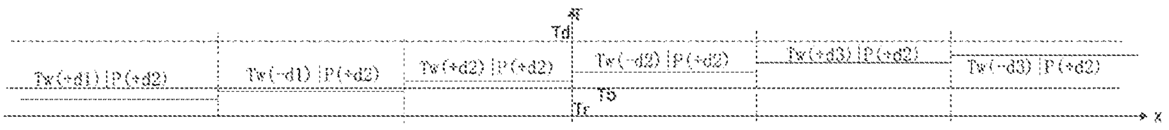
FIG. 27B is a temperature profile of FIG. 27A.

Optionally, 3) writing the magnetic moment direction+d2 of the anti-ferromagnetic layer in the +d2 push magnetoresistive sensing unit array comprises the following 2 methods:

Method I: As shown in FIG. 27A, a laser spot 8 scans a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 along a direction 9, a magnetic field generating apparatus (not marked here) generates a direction+d2 magnetic field 6(2), and only the +d2 push magnetoresistive sensing unit array 13, the −d2 pull magnetoresistive sensing unit array 14, the +d3 push magnetoresistive sensing unit array 15 and the −d3 pull magnetoresistive sensing unit array 16 are written into a direction+d2 magnetic field 13(2); and a temperature profile thereof is as shown in FIG. 27B, with Tr<Tw(+d1)|P(+d2)<Tw(−d1)|P(+d2)<Tb<Tw(+d2)|P(+d2)<Tw(−d2)|P(+d2)<Tw(+d3)|P(+d2)<Tw(−d3)|P(+d2)<Td.

Figure 28A:
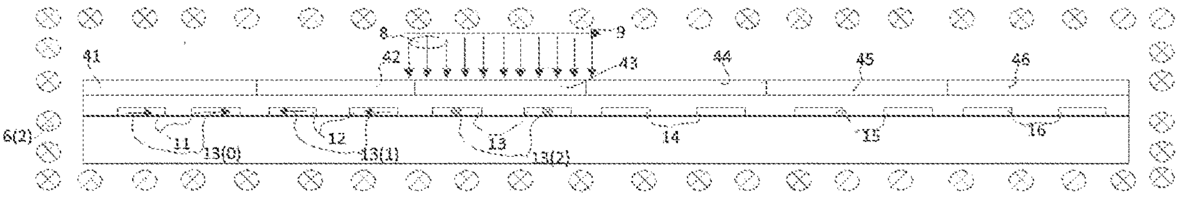
FIG. 28A is a schematic diagram of a+d2 magnetic moment in a three-axis push-pull magnetoresistive sensor written during local laser programming.
Figure 28B:
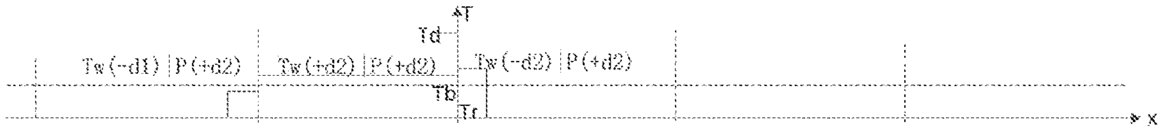
FIG. 28B is a temperature profile of FIG. 28A.

Method II: As shown in FIG. 28A, a laser spot 8 scans a +d2 push magnetoresistive sensing unit array 13 along a direction 9, a magnetic field generating apparatus generates a direction+d2 magnetic field 6(2), a direction+d2 magnetic field 13(2) is written into the +d2 push magnetoresistive sensing unit array 13 only, a magnetic moment of an adjacent −d1 pull magnetoresistive sensing unit array 12 is not affected, and a magnetic moment of an adjacent −d2 pull magnetoresistive sensing unit array 14 is affected; and a temperature profile thereof is as shown in FIG. 28B, with Tr<Tw(−d1)|P(+d2)<Tb<Tw(+d2)|P(+d2)<Tw(−d2)|P(+d2)<Td.

Figure 29A:
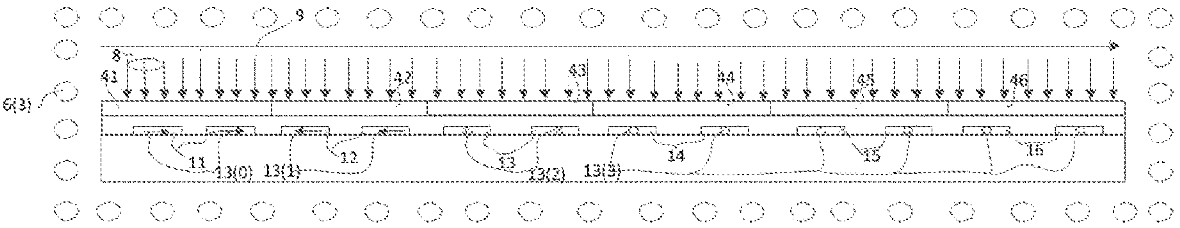
FIG. 29A is a schematic diagram of a−d2 magnetic moment in a three-axis push-pull magnetoresistive sensor written during global laser programming.
Figure 29B:
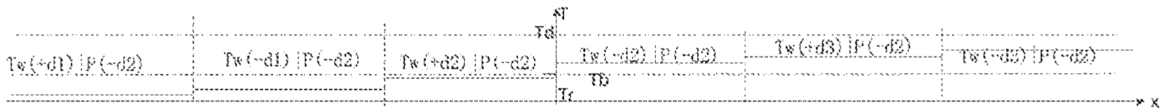
FIG. 29B is a temperature profile of FIG. 29A.

Optionally, 4) writing the magnetic moment direction −d2 of the anti-ferromagnetic layer in the −d2 pull magnetoresistive sensing unit array comprises the following 2 methods:

Method I: As shown in FIG. 29A, a laser spot 8 scans a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 along a direction 9, a magnetic field generating apparatus (not marked here) generates a direction −d2 magnetic field 6(3), and only the −d2 pull magnetoresistive sensing unit array 14, the +d3 push magnetoresistive sensing unit array 15 and the −d3 pull magnetoresistive sensing unit array 16 are written into a direction −d2 magnetic field 13(3); and a temperature profile thereof is as shown in FIG. 29B, with Tr<Tw(+d1)P(−d2)<Tw(−d1)|P(−d2)<Tw(+d2)|P(−d2)<Tb<Tw(−d2)|P(−d2)<Tw(+d3)|P(−d2)<Tw(−d3)|P(−d2)<Td.

Figure 30A:
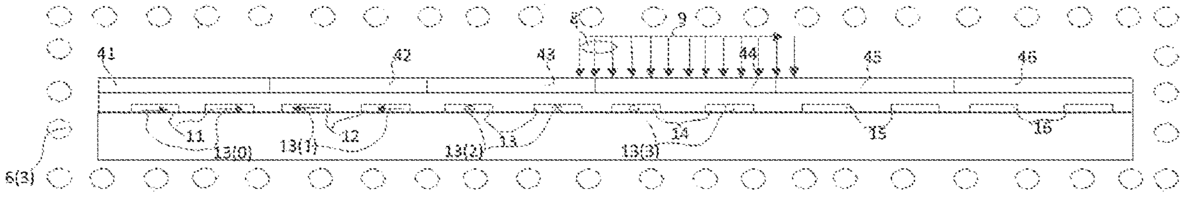
FIG. 30A is a schematic diagram of a−d2 magnetic moment in a three-axis push-pull magnetoresistive sensor written during local laser programming.
Figure 30B:
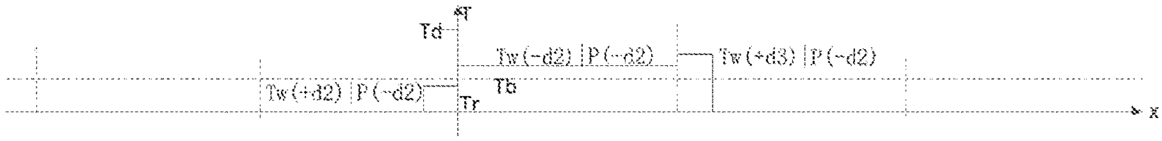
FIG. 30B is a temperature profile of FIG. 30A.

Method II: As shown in FIG. 30A, a laser spot 8 scans a −d2 pull magnetoresistive sensing unit array 14 along a direction 9, a magnetic field generating apparatus generates a direction −d2 magnetic field 6(3), a direction −d2 magnetic moment 13(3) is written into the −d2 pull magnetoresistive sensing unit array 14 only, a magnetic moment of an adjacent+d2 push magnetoresistive sensing unit array 13 is not affected, and a magnetic moment of an adjacent+d3 push magnetoresistive sensing unit array 15 is affected; and a temperature profile thereof is as shown in FIG. 30B, with Tr<Tw(+d2)|P(−d2)<Tb<Tw(−d2)|P(−d2)<Td<Tw(+d3)|P(−d2)<Td.

Figure 31A:
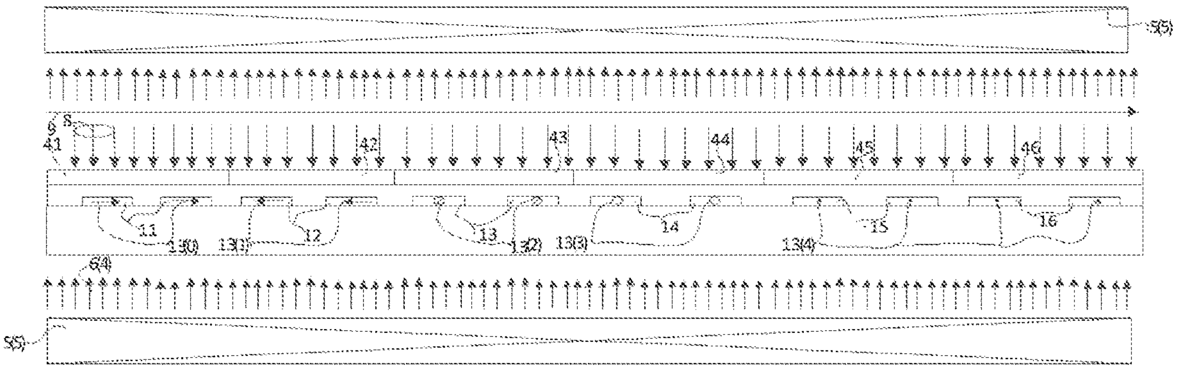
FIG. 31A is a schematic diagram of a+d3 magnetic moment in a three-axis push-pull magnetoresistive sensor written during global laser programming.
Figure 31B:
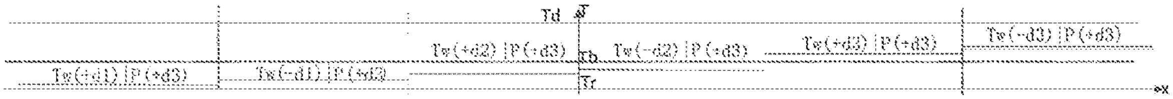
FIG. 31B is a temperature profile of FIG. 31A.

Optionally, 5) writing the magnetic moment direction+d3 of the anti-ferromagnetic layer in the +d3 push magnetoresistive sensing unit array comprises the following 2 methods:

Method I. As shown in FIG. 31A, a laser spot 8 scans a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 along a direction 9, a magnetic field generating apparatus 5(5) generates a direction+d3 magnetic field 6(4), and a direction+d3 magnetic moment 13(4) is written into the +d3 push magnetoresistive sensing unit array 15 and the −d3 pull magnetoresistive sensing unit array 16 only; and a temperature profile thereof is as shown in FIG. 31B, with Tr<Tw(+d1)|P(+d3)<Tw(−d1)|P(+d3)<Tw(+d2)|P(+d3)<Tw(−d2)|P(+d3)<Tb<Tw(+d3)|P(+d3)<Tw(−d3)|P(+d3)<Td.

Figure 32A:
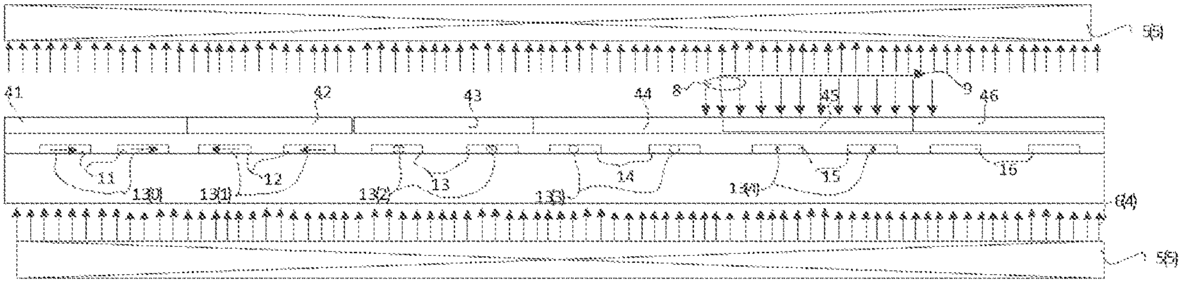
FIG. 32A is a schematic diagram of a+d3 magnetic moment in a three-axis push-pull magnetoresistive sensor written during local laser programming.
Figure 32B:
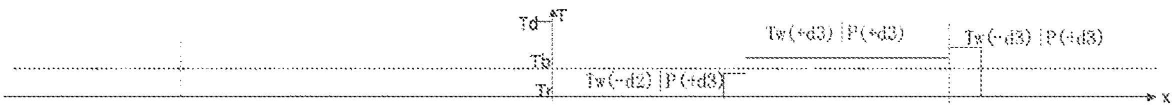
FIG. 32B is a temperature profile of FIG. 32A.

Method II: As shown in FIG. 32A, a laser spot 8 scans a +d3 push magnetoresistive sensing unit array 15 along a direction 9, a magnetic field generating apparatus 5(5) generates a direction+d3 magnetic field 6(4), a direction+d3 magnetic field 13(4) is written into the +d3 push magnetoresistive sensing unit array 15 only, a magnetic moment of an adjacent −d2 pull magnetoresistive sensing unit array 14 is not affected, and a magnetic moment of an adjacent −d3 pull magnetoresistive sensing unit array 16 is affected; and a temperature profile thereof is as shown in FIG. 32B, with Tr<Tw(−d2)|P(+d3)<Td<Tw(+d3)|P(+d3)<Tw(−d3)|P(+d3)<Td.

Figure 33A:
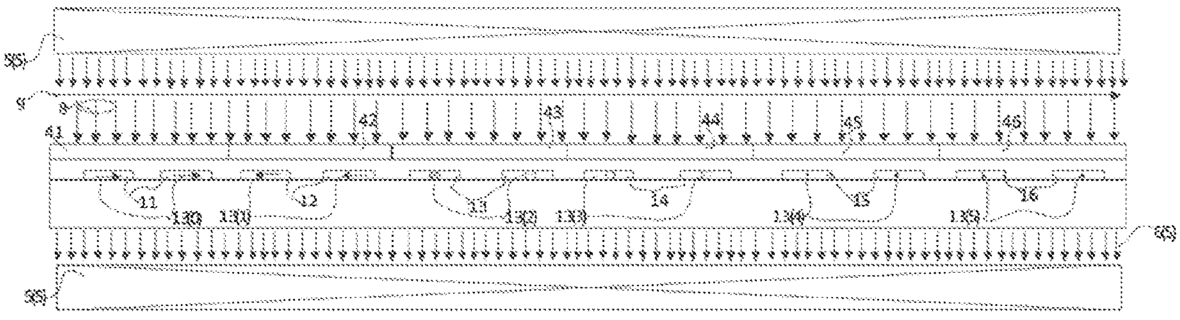
FIG. 33A is a schematic diagram of a−d3 magnetic moment in a three-axis push-pull magnetoresistive sensor written during global laser programming.
Figure 33B:
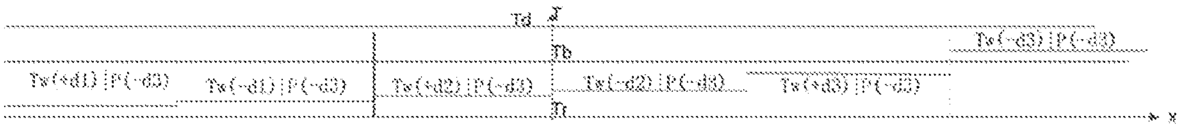
FIG. 33B is a temperature profile of FIG. 33A.

Optionally, 6) writing the magnetic moment direction −d3 of the anti-ferromagnetic layer in the −d3 pull magnetoresistive sensing unit array comprises the following 2 methods:

Method I. As shown in FIG. 33A, a laser spot 8 scans a +d1 push magnetoresistive sensing unit array 11 and a −d1 pull magnetoresistive sensing unit array 12, a +d2 push magnetoresistive sensing unit array 13 and a −d2 pull magnetoresistive sensing unit array 14 as well as a +d3 push magnetoresistive sensing unit array 15 and a −d3 pull magnetoresistive sensing unit array 16 along a direction 9, a magnetic field generating apparatus 5(5) generates a direction −d3 magnetic field 6(5), and a direction −d3 magnetic moment 13(5) is written into the −d3 pull magnetoresistive sensing unit array 16 only; and a temperature profile thereof is as shown in FIG. 33B, with Tr<Tw(+d1)|P(−d3)<Tw(−d1)|P(−d3)<Tw(+d2)|P(−d3)<Tw(−d2)|1)(−d3)<Tw(+d3)P(−d3)<Tb<Tw(−d3)P(−d3)<Td.

Figure 34A:
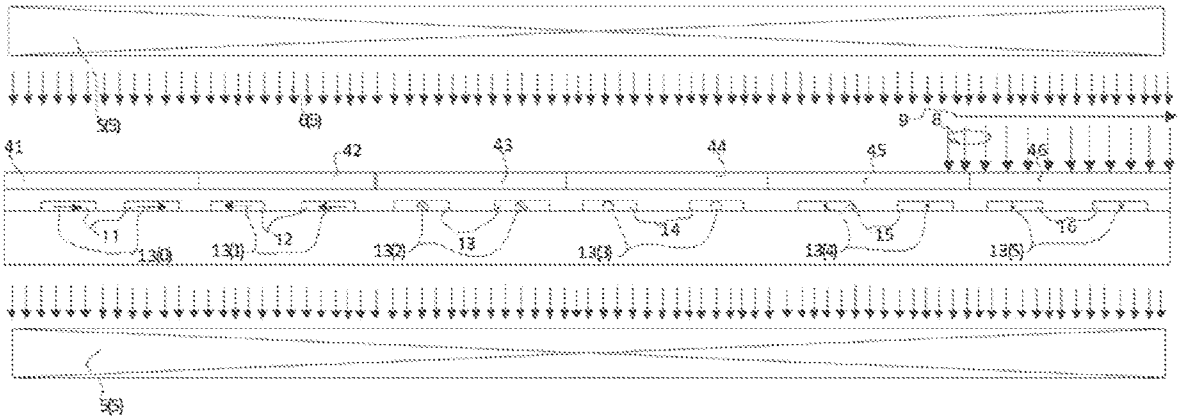
FIG. 34A is a schematic diagram of a−d3 magnetic moment in a three-axis push-pull magnetoresistive sensor written during local laser programming.
Figure 34B:
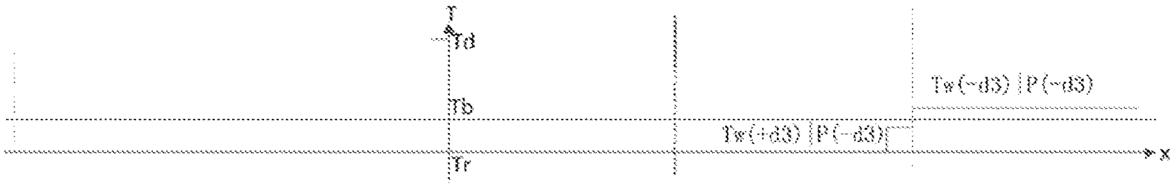
FIG. 34B is the temperature profile of FIG. 34A.

Method II: As shown in FIG. 34A, a laser spot 8 scans a −d3 pull magnetoresistive sensing unit array 16 along a direction 9, a magnetic field generating apparatus 5(5) generates a direction −d3 magnetic field 6(5), a direction −d3 magnetic moment 13(5) is written into the −d3 pull magnetoresistive sensing 25 unit array 16 only, and a magnetic moment of an adjacent+d3 push magnetoresistive sensing unit array 15 is not affected; and a temperature profile is as shown in FIG. 34B, with Tr<Tw(+d3)P(−d3)<Td<Tw(−d3)|P(−d3)<Td.

Note that the above are only the preferred embodiments of the present invention and the applied technical principles. Those skilled in the art will understand that the present invention is not limited to the specific embodiments herein, and those skilled in the art can make various obvious changes, readjustments, combinations and substitutions without departing from the scope of the present invention. Therefore, although the present invention has been described in more detail through the above embodiments, the present invention is not limited thereto, and may include more other equivalent embodiments without departing from the concept of the present invention, and the scope of the present invention is determined by the scope of the appended claims.

The invention claimed is:

1. A laser-programmable magnetoresistive device, comprising:

a substrate;

a magnetoresistive sensor disposed on the substrate, the magnetoresistive sensor comprising a magnetoresistive sensing unit having a multilayer thin-film stacked structure that includes an anti-ferromagnetic layer;

a non-magnetic insulating layer disposed on the magnetoresistive sensor, the non-magnetic insulating layer configured to electrically isolate the magnetoresistive sensor;

a thermal control layer disposed on the non-magnetic insulating layer, the thermal control layer positioned to transmit laser radiation through the thermal control layer to the magnetoresistive sensor during laser writing of the anti-ferromagnetic layer, wherein at least one of a material and a thickness of at least one of the thermal control layer and a film of the magnetoresistive sensor is selected to change transmission of the laser radiation through the thermal control layer to modulate a writing temperature of the magnetoresistive sensor for a given laser power.

2. The magnetoresistive device according to claim 1, wherein the magnetoresistive sensor is a giant magnetoresistive (GMR) sensor, a tunnel magnetoresistive (TMR) sensor or an anisotropic magnetoresistive (AMR) sensor.

3. The magnetoresistive device according to claim 1, wherein in a direction from the substrate to the thermal control layer, the multilayer thin-film stacked structure comprises a seed layer, the anti-ferromagnetic layer, a free layer, a top electrode layer and a cap layer which are sequentially arranged in a stacked manner, and a first insulating layer that is distinct from the non-magnetic insulating layer is provided between the substrate and the seed layer;

wherein a material of at least one film layer of the thermal control layer, the first insulating layer, the seed layer, the top electrode layer and the cap layer is selected to change transmission of the laser radiation to the anti-ferromagnetic layer, thereby increase or decrease the writing temperature of the magnetoresistive sensor for a given laser power; and/or wherein a thickness of at least one film layer of the thermal control layer, the first insulating layer, the seed layer, the top electrode layer and the cap layer is selected to change transmission of the laser radiation to the anti-ferromagnetic laver, thereby increase or decrease a writing temperature of the magnetoresistive sensor for a given laser power.

4. The magnetoresistive device according to claim 1, wherein the magnetoresistive sensor is a push-pull magnetoresistive sensor, the push-pull magnetoresistive sensor is composed of a push magnetoresistive sensing unit array and a pull magnetoresistive sensing unit array, and both the push magnetoresistive sensing unit array and the pull magnetoresistive sensing unit array are composed of magnetoresistive sensing units.

5. The magnetoresistive device according to claim 4, wherein the push-pull magnetoresistive sensor is of a full-bridge structure, a half-bridge structure or a quasi-bridge structure.

6. The magnetoresistive device according to claim 4, wherein the push-pull magnetoresistive sensor is a single-axis push-pull magnetoresistive sensor, a two-axis push-pull magnetoresistive sensor or a three-axis push-pull magnetoresistive sensor.

7. The magnetoresistive device according to claim 1, wherein constituent materials of the thermal control layer comprise non-magnetic laser low absorption coefficient materials or laser high absorption coefficient materials, the laser low absorption coefficient materials comprise at least one of tantalum, titanium, copper, molybdenum, gold, silver, aluminum, platinum and tin, and the laser high absorption coefficient materials comprise at least one of zirconium oxide, titanium oxide, carbon film, phosphate and aluminum titanium nitride.

8. The magnetoresistive device according to claim 1, wherein constituent materials of the thermal control layer comprise carbon black, a non-magnetic laser absorbing resin or a non-magnetic laser absorbing coating.

9. The magnetoresistive device according to claim 1, wherein the laser has a wavelength in a range of 100 nm to 3000 nm.

10. A method of programming laser-programmable magnetoresistive devices according to claim 1, wherein the method comprises:

transmitting laser radiation through the thermal control layer to the magnetoresistive sensor. wherein the at least one of a material and a thickness of the at least one of the thermal control layer and a film of the magnetoresistive sensor has been selected to change transmission of the laser radiation through the thermal control layer; and heating the magnetoresistive sensor with the transmitted laser radiation to the writing temperature for the given laser power.

11. The method according to claim 10, wherein the magnetoresistive sensor is a push-pull magnetoresistive sensor, the push-pull magnetoresistive sensor comprises a push magnetoresistive sensing unit array and a pull magnetoresistive sensing unit array, an anti-ferromagnetic layer of the push magnetoresistive sensing unit array has a magnetic moment direction +di, and an anti-ferromagnetic layer of the pull magnetoresistive sensing unit array has a magnetic moment direction −di, i is a positive integer and 1≤1≤3; and the laser writing method for programming further comprises: writing a magnetic moment into an anti-ferromagnetic layer of the push-pull magnetoresistive sensor which comprises writing the magnetic moment direction +di of the anti-ferromagnetic layer into the push magnetoresistive sensing unit array, and writing the magnetic moment direction −di of the anti-ferromagnetic layer into the pull magnetoresistive sensing unit array.

12. The method according to claim 11, wherein writing the magnetic moment direction +di of the anti-ferromagnetic layer into the push magnetoresistive sensing unit array comprises:

setting a magnetic field annealing power to Poven and an annealing temperature of a wafer to Tw, and performing direction +di magnetic field thermal annealing on the wafer, so that the anti-ferromagnetic layer of each of the magnetoresistive sensing unit arrays has the magnetic moment direction +di; or setting the laser power to P (+di) and a writing temperature of the magnetoresistive sensing unit array to Tdi, and generating a direction +di magnetic field to write the direction +di magnetic moment into the anti-ferromagnetic layer of the push magnetoresistive sensing unit array.

13. The method according to claim 12, wherein writing the magnetic moment direction −di of the anti-ferromagnetic layer into the pull magnetoresistive sensing unit array comprises:

setting the magnetic field annealing power to Poven and the temperature to Tw, and performing direction −di magnetic field thermal annealing on the wafer, so that the anti-ferromagnetic layer of each of the magnetoresistive sensing unit arrays has the magnetic moment direction −di; or setting the laser power to P (−di) and the temperature to Tdi, and generating a direction −di magnetic field to write the direction-di magnetic moment into the anti-ferromagnetic layer of the pull magnetoresistive sensing unit array.

14. The method according to claim 13, wherein Td1<Td2<Td3.

15. The method according to claim 14, wherein Tb<Td1<Td2<Td3<Td, where the Tb is a writing temperature of the magnetoresistive sensing unit arrays, and the Td is a damage temperature of the magnetoresistive sensing unit arrays.

16. The magnetoresistive device according to claim 1, wherein the thermal control layer is substantially transmissive to the laser radiation such that a majority of the laser radiation incident on the thermal control layer is transmitted through the thermal control layer to the magnetoresistive sensor.

17. The magnetoresistive device according to claim 1, wherein the thermal control layer comprises an air layer.

18. The magnetoresistive device according to claim 4, wherein the thermal control layer comprises a first region overlying the push magnetoresistive sensing unit array and a second region overlying the pull magnetoresistive sensing unit array, wherein the first region and the second region differ in at least one of material and thickness, such that, for the given laser power, the push magnetoresistive sensing unit array reaches a different writing temperature than the pull magnetoresistive sensing unit array.

19. The magnetoresistive device according to claim 18, wherein anti-ferromagnetic layers of the push magnetoresistive sensing unit array have a first magnetic moment direction and anti-ferromagnetic layers of the pull magnetoresistive sensing unit array have a second magnetic moment direction opposite to the first magnetic moment direction.

20. The magnetoresistive device according to claim 1, wherein the thermal control layer comprises a non-magnetic laser low absorption coefficient material selected from the group consisting of tantalum, titanium, copper, molybdenum, gold, silver, aluminum, platinum, and tin.

* * * * *